United States Patent
Park et al.

(10) Patent No.: US 9,627,481 B2
(45) Date of Patent: Apr. 18, 2017

(54) SEMICONDUCTOR DEVICE HAVING AN INACTIVE-FIN

(71) Applicant: SAMSUNG ELECTRONICS CO., LTD., Suwon-si, Gyeonggi-Do (KR)

(72) Inventors: Byungjae Park, Seongnam-si (KR); Myeongcheol Kim, Suwon-si (KR); Hagju Cho, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/051,056

(22) Filed: Feb. 23, 2016

(65) Prior Publication Data

US 2016/0351663 A1  Dec. 1, 2016

(30) Foreign Application Priority Data

Jun. 1, 2015 (KR) .................. 10-2015-0077404

(51) Int. Cl.
H01L 29/08 (2006.01)
H01L 29/78 (2006.01)
H01L 27/088 (2006.01)

(52) U.S. Cl.
CPC ...... *H01L 29/0847* (2013.01); *H01L 27/0886* (2013.01); *H01L 29/7856* (2013.01)

(58) Field of Classification Search
CPC ............. H01L 29/0847; H01L 29/7856; H01L 27/0886
See application file for complete search history.

(56) References Cited

U.S. PATENT DOCUMENTS

| | | | | |
|---|---|---|---|---|
| 7,719,058 B2* | 5/2010 | Seliskar | ............ | H01L 21/82348 257/347 |
| 8,377,779 B1* | 2/2013 | Wang | ................ | H01L 29/66795 257/E21.421 |
| 8,603,893 B1 | 12/2013 | Wei et al. | | |
| 8,815,670 B2 | 8/2014 | Basker et al. | | |
| 8,999,779 B2* | 4/2015 | Naczas | ................ | H01L 23/535 257/353 |
| 9,153,694 B2* | 10/2015 | Xie | ........................ | H01L 29/785 |
| 9,202,918 B2* | 12/2015 | Xie | ........................ | H01L 29/785 |
| 9,324,656 B1* | 4/2016 | Labonte | ............ | H01L 21/76831 |
| 9,397,099 B1* | 7/2016 | Huang | ................ | H01L 29/785 |
| 9,455,176 B2* | 9/2016 | Tsao | ................ | H01L 21/76224 |
| 2008/0203440 A1* | 8/2008 | Tsuchiaki | .......... | H01L 21/26506 257/255 |
| 2014/0035053 A1* | 2/2014 | Kawa | ................ | H01L 27/0207 257/368 |
| 2014/0117454 A1 | 5/2014 | Liu et al. | | |
| 2014/0145248 A1 | 5/2014 | Cheng et al. | | |
| 2014/0159159 A1* | 6/2014 | Steigerwald | ...... | H01L 29/66795 257/369 |
| 2015/0014774 A1 | 1/2015 | Anderson et al. | | |
| 2016/0104637 A1* | 4/2016 | Hung | ................ | H01L 21/76897 438/660 |

(Continued)

*Primary Examiner* — Ida M Soward
(74) *Attorney, Agent, or Firm* — F. Chau & Associates, LLC

(57) ABSTRACT

A semiconductor device includes a multi-fin active region having a plurality of sub-fins sequentially arranged on a substrate. A gate electrode crosses the multi-fin active region. Source/drain regions are disposed on the sub-fins except a first sub-fin and a last sub-fin. A contact plug is disposed on the source/drain regions.

20 Claims, 26 Drawing Sheets

(56) References Cited

U.S. PATENT DOCUMENTS

2016/0104787 A1* 4/2016 Kittl .................. H01L 29/41725
　　　　　　　　　　　　　　　　　　438/283
2016/0190325 A1* 6/2016 Liu .................... H01L 29/7856
　　　　　　　　　　　　　　　　　　257/401
2016/0211251 A1* 7/2016 Liaw .................. H01L 27/0207

* cited by examiner

SEMICONDUCTOR DEVICE HAVING AN INACTIVE-FIN

CROSS-REFERENCE TO RELATED APPLICATION

This application claims priority under 35 U.S.C. §119 to Korean Patent Application No. 10-2015-0077404 filed on Jun. 1, 2015, the disclosure of which is incorporated by reference herein in its entirety.

TECHNICAL FIELD

Exemplary embodiments of the inventive concept relate to a semiconductor device having an inactive-fin and a method of forming the same.

DESCRIPTION OF RELATED ART

As semiconductor devices have become highly integrated, the size of the semiconductor devices decreases. This complicates a process of forming gate electrodes and source/drains. For example, the source/drains are formed adjacent to side surfaces of the gate electrodes. However, during the process of forming the gate electrodes, the source/drains can be damaged.

SUMMARY

In accordance with an exemplary embodiment of the inventive concept, a semiconductor device includes a multi-fin active region having a plurality of sub-fins sequentially arranged on a substrate. A gate electrode crosses the multi-fin active region. Source/drain regions are disposed on the sub-fins except a first sub-fin and a last sub-fin. A contact plug is disposed on the source/drain regions.

The gate electrode may include a first portion disposed between the sub-fins and a second portion disposed on an outer side of the multi-fin active region. A lower end of the second portion of the gate electrode may be disposed at a lower level than that of the first portion of the gate electrode.

The source/drain regions may include a selective epitaxial growth (SEG) pattern.

Sides of the source/drain regions may be in contact with each other.

A device isolation layer may be disposed between the sub-fins and at an outer side of the multi-fin active region. The device isolation layer may include a first portion between the sub-fins and a second portion on the outer side of the multi-fin active region. An upper surface of the second portion of the device isolation layer may be disposed at a lower level than that of the first portion of the device isolation layer.

A lower end of the second portion of the device isolation layer may be disposed at a lower level than that of the first portion of the device isolation layer.

The second portion of the device isolation layer may have a greater horizontal width than the first portion of the device isolation layer.

The gate electrode may extend onto the device isolation layer.

The first sub-fin may include a first side surface and a second side surface opposite the first side surface. An upper end of the first sub-fin may be at a higher level than the device isolation layer. An uppermost contact point of the second portion of the device isolation layer and the first side surface of the first sub-fin may be disposed at a lower level than an uppermost contact point of the first portion of the device isolation layer and the second side surface of the first sub-fin.

A first lower insulating layer may cover the first sub-fin and the last sub-fin. A second lower insulating layer may be disposed on the sub-fins except the first sub-fin and the last sub-fin. An upper insulating layer may be disposed on the first lower insulating layer and the second lower insulating layer. The contact plug may pass through the upper insulating layer and the second lower insulating layer and may be in contact with the sub-fins except the first sub-fin and the last sub-fin.

An etch stop layer may be disposed on the source/drain regions and between the first lower insulating layer and the second lower insulating layer.

Upper surfaces of the first lower insulating layer, the second lower insulating layer, and the etch stop layer may be substantially coplanar.

In accordance with an exemplary embodiment of the inventive concept, a semiconductor device includes a multi-fin active region having a plurality of sub-fins sequentially arranged on a substrate. A device isolation layer is disposed between the sub-fins and at an outer side of the multi-fin active region. A gate electrode crosses the multi-fin active region and extends onto the device isolation layer. SEG patterns are disposed on the sub-fins. A contact plug is disposed on the SEG patterns. A first sub-fin among the sub-fins is spaced apart from the SEG patterns.

A last sub-fin among the sub-fins may be spaced apart from the SEG patterns.

The device isolation layer may include a first portion between the sub-fins and a second portion disposed on the outer side of the multi-fin active region. An upper surface of the second portion of the device isolation layer may be disposed at a lower level than that of the first portion of the device isolation layer.

The gate electrode may include a first portion disposed between the sub-fins and a second portion disposed on the outer side of the multi-fin active region. A lower end of the second portion of the gate electrode may be disposed at a lower level than that of the first portion of the gate electrode.

The first sub-fin may include a first side surface and a second side surface opposite the first side surface. An upper end of the first sub-fin may be at a higher level than the device isolation layer. An uppermost contact point of the second portion of the device isolation layer and the first side surface of the first sub-fin may be disposed at a lower level than an uppermost contact point of the first portion of the device isolation layer and the second side surface of the first sub-fin.

In accordance with an exemplary embodiment of the inventive concept, a semiconductor device includes a multi-fin active region having a plurality of sub-fins sequentially arranged on a substrate. A device isolation layer is disposed between the sub-fins and at an outer side of the multi-fin active region. A first lower insulating layer covers a first sub-fin and a last sub-fin among the sub-fins. A second lower insulating layer is disposed on the sub-fins except the first sub-fin and the last sub-fin. An upper insulating layer is disposed on the first lower insulating layer and the second lower insulating layer. A contact plug passes through the upper insulating layer and the second lower insulating layer and is in contact with the sub-fins except the first sub-fin and the last sub-fin.

The first sub-fin and the last sub-fin may not be in contact with the contact plug.

An etch stop layer may be disposed between the first lower insulating layer and the second lower insulating layer. Upper surfaces of the first lower insulating layer, the second lower insulating layer, and the etch stop layer may be substantially coplanar.

SEG patterns may be disposed on the sub-fins except the first sub-fin and the last sub-fin. The contact plug may be disposed on the SEG patterns.

In accordance with an exemplary embodiment of the inventive concept, a method of forming a semiconductor device includes forming a multi-fin active region having a plurality of sub-fins sequentially arranged on a substrate. A gate electrode crossing the multi-fin active region is formed. A first lower insulating layer covering a first sub-fin and a last sub-fin among the sub-fins is formed. SEG patterns are formed on the sub-fins except the first sub-fin and the last sub-fin. A second lower insulating layer is formed on the SEG patterns. An upper insulating layer is formed on the first lower insulating layer and the second lower insulating layer. A contact plug which passes through the upper insulating layer and the second lower insulating layer and is in contact with the SEG patterns is formed.

The gate electrode may include a first portion between the sub-fins and a second portion on an outer side of the multi-fin active region. A lower end of the second portion of the gate electrode may be formed at a lower level than that of the first portion of the gate electrode.

An etch stop layer may be formed between the first lower insulating layer and the second lower insulating layer and on the SEG patterns.

Upper surfaces of the first lower insulating layer, the second lower insulating layer, and the etch stop layer may be substantially coplanar.

A device isolation layer may be formed between the sub-fins and at an outer side of the multi-fin active region. The device isolation layer may include a first portion between the sub-fins and a second portion on the outer side of the multi-fin active region. An upper surface of the second portion of the device isolation layer may be formed at a lower level than that of the first portion of the device isolation layer.

The second portion of the device isolation layer may have a greater horizontal width than the first portion of the device isolation layer.

In accordance with an exemplary embodiment of the inventive concept, a semiconductor device includes: a plurality of fins sequentially arranged on a well on a substrate; a plurality of SEG patterns overlapping each of the fins, except for a first fin and a last fin of the plurality of fins; a gate electrode crossing over the plurality of fins; and a contact plug disposed on the SEG patterns.

The first fin and the last fin may be overlapped by a spacer.

The semiconductor device may be an input/output device or a diode.

BRIEF DESCRIPTION OF THE DRAWINGS

The foregoing and other features of the inventive concept will become more apparent by describing in detail exemplary embodiments thereof with reference to the accompanying drawings. In the drawings.

DETAILED DESCRIPTION OF THE EMBODIMENTS

Exemplary embodiments of the inventive concept will now be described more fully with reference to the accompanying drawings. The inventive concept may, however, be embodied in many different forms and should not be construed as being limited to the embodiments set forth herein.

As used herein, the singular forms "a," "an," and "the" are intended to include the plural forms as well, unless the context clearly indicates otherwise.

When one element(s) is/are referred to as "connected" or "coupled" to other element(s), this may indicate directly connected or coupled to the elements(s), or intervening elements may be present.

Exemplary embodiments of the inventive concept are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Like numbers refer to like elements throughout this application. Thus, the same or similar numbers may be described with reference to other drawings even if they are neither mentioned nor described in the corresponding drawing. In addition, elements that are not denoted by reference numbers may be described with reference to other drawings.

Figure 1:
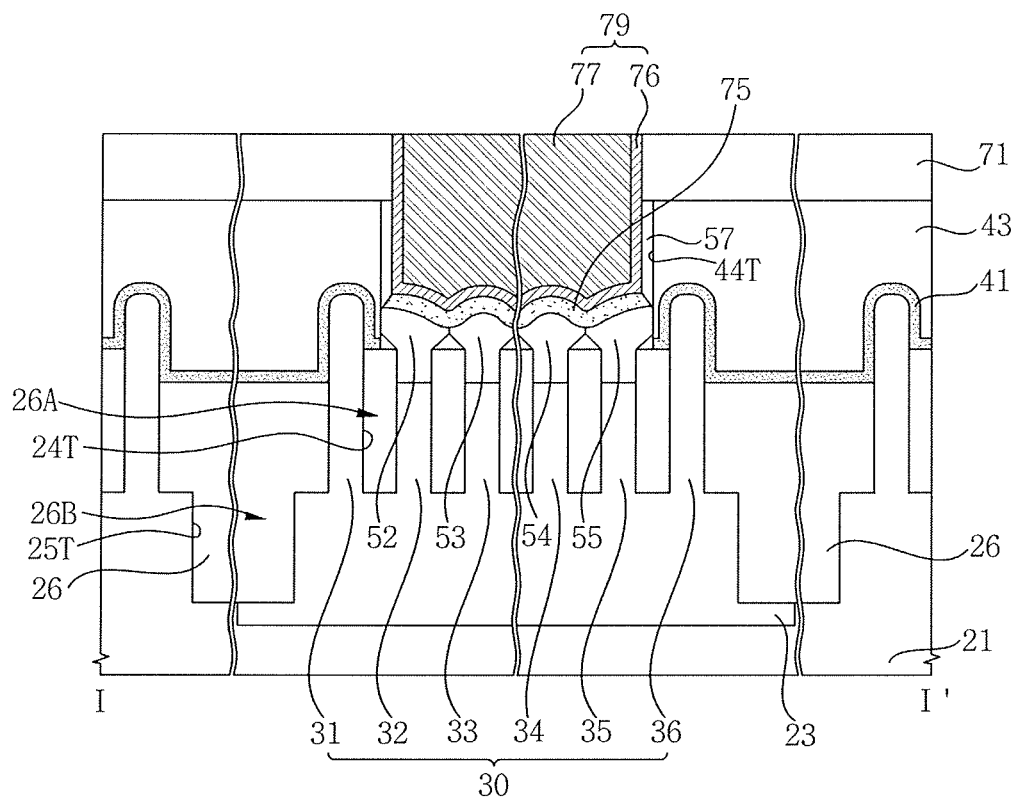
FIG. 1 is a cross-sectional view for describing a semiconductor device according to an exemplary embodiment of the inventive concept.
Figure 2:
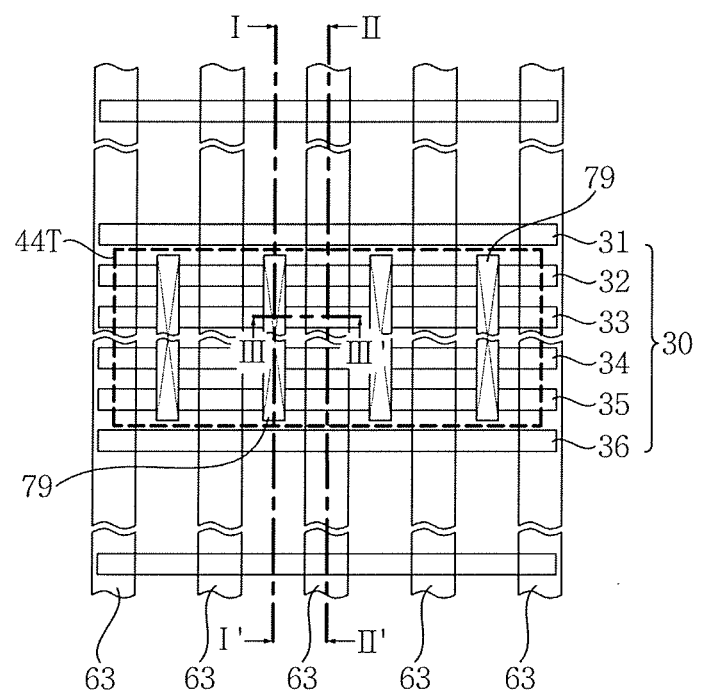
FIG. 2 is a layout for describing a semiconductor device according to an exemplary embodiment of the inventive concept.
Figure 3:
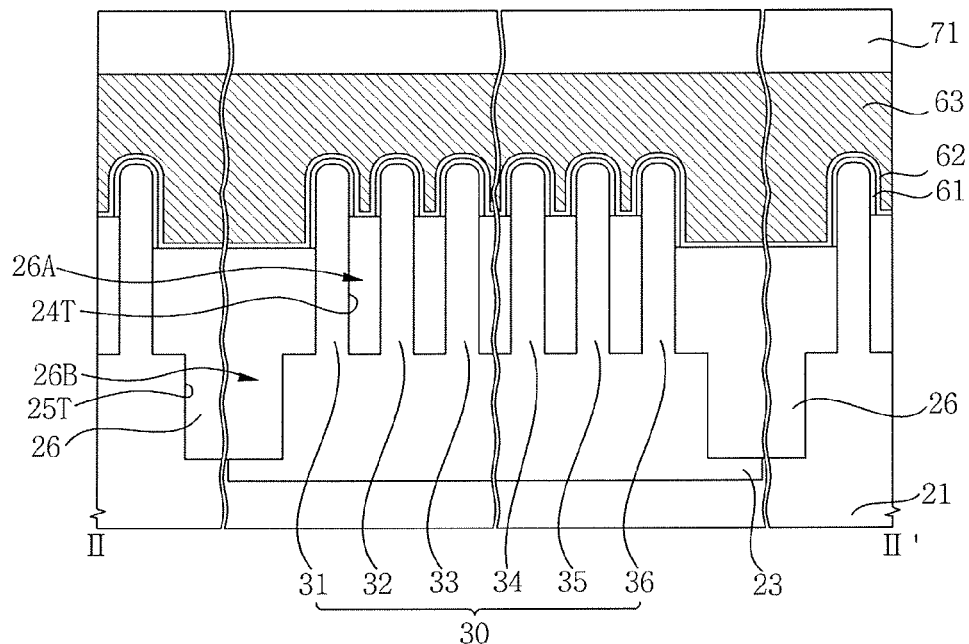
FIGS. 3, 4, 5 and 6 are cross-sectional views for describing a semiconductor device according to an exemplary embodiment of the inventive concept.
Figure 4:
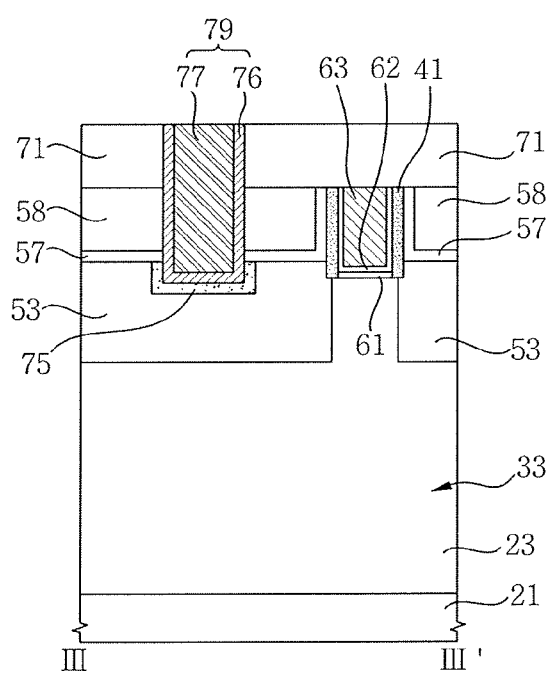
Figure 5:
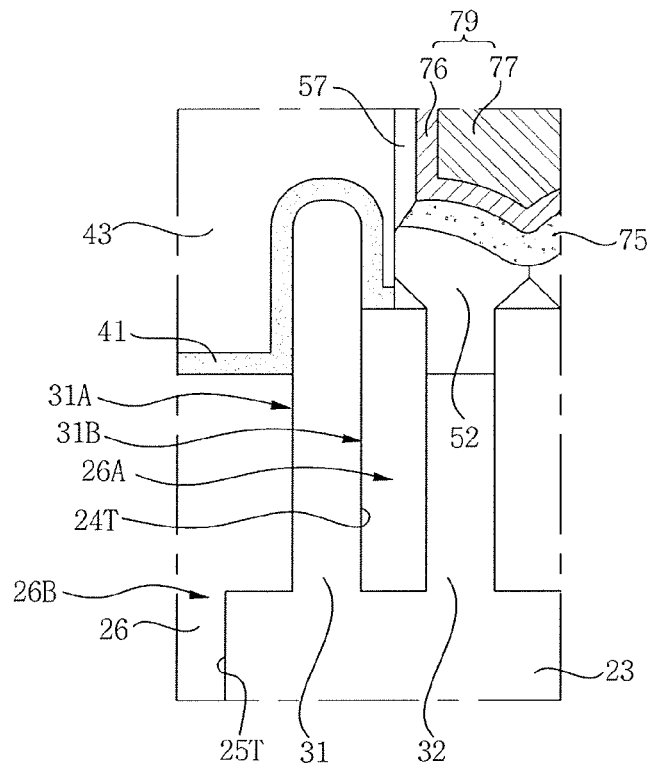
Figure 6:
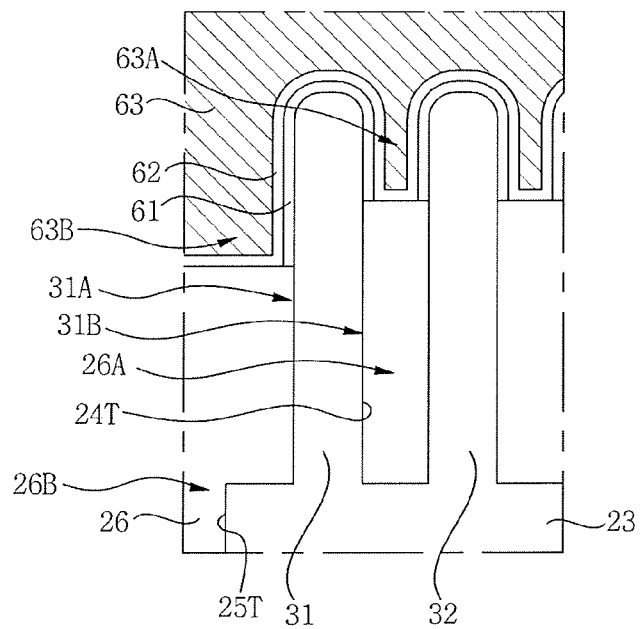

FIGS. 1, 3, and 4 are cross-sectional views for describing a semiconductor device according to an exemplary embodiment of the inventive concept, FIG. 2 is a layout for describing a semiconductor device according to an exemplary embodiment of the inventive concept, FIG. 5 is an enlarged view illustrating a part of FIG. 1 in detail, and FIG. 6 is an enlarged view illustrating a part of FIG. 3 in detail.

Referring to FIG. 1, a well 23, first trenches 24T, second trenches 25T, a device isolation layer 26, a multi-fin active region 30, spacers 41, a first lower insulating layer 43, a drain trench 44T, selective epitaxial growth (SEG) patterns 52, 53, 54, and 55, an etch stop layer 57, an upper insulating layer 71, a metal silicide layer 75, and contact plugs 79 may be formed on a substrate 21. The device isolation layer 26 may include first portions 26A and second portions 26B. The multi-fin active region 30 may include N sub-fins 31, 32, 33, 34, 35, and 36. The multi-fin active region 30 may include a first sub-fin 31, a second sub-fin 32, a third sub-fin 33, an $(N-2)^{th}$ sub-fin 34, an $(N-1)^{th}$ sub-fin 35, and an $N^{th}$ sub-fin 36. Here, N is an integer. For example, N may be an integer of 1000 or less. The contact plugs 79 may include a barrier layer 76 and a conductive layer 77. The SEG patterns 52, 53, 54, and 55 may include a first SEG pattern 52, a second SEG pattern 53, a third SEG pattern 54, and a fourth SEG pattern 55.

Referring to FIG. 2, gate electrodes 63 crossing the multi-fin active region 30 may be formed. The contact plugs 79 may be formed on the multi-fin active region 30 between the gate electrodes 63. The first to $N^{th}$ sub-fins 31 to 36 may be in parallel with each other. The drain trench 44T may be disposed on the second to $(N-1)^{th}$ sub-fins 32 to 35. The first and $N^{th}$ sub-fins 31 and 36 may be located outside of the drain trench 44T. The contact plugs 79 may cross the second to $(N-1)^{th}$ sub-fins 32 to 35. In other words, the contact plugs 79 may overlap the second to $(N-1)^{th}$ sub-fins 32 to 35. The first and $N^{th}$ sub-fins 31 and 36 may be located outside of the group of the contact plugs 79. The first and $N^{th}$ sub-fins 31 and 36 may not overlap the contact plugs 79.

Referring to FIG. 3, the well 23, the first trenches 24T, the second trenches 25T, the device isolation layer 26, the multi-fin active region 30, a lower gate dielectric layer 61, an upper gate dielectric layer 62, a gate electrode 63, and the upper insulating layer 71 may be formed on the substrate 21.

Referring to FIG. 4, the well 23, the third sub-fin 33, the spacers 41, the second SEG pattern 53, the etch stop layer 57, a second lower insulating layer 58, the lower gate dielectric layer 61, the upper gate dielectric layer 62, the gate electrode 63, the upper insulating layer 71, the metal silicide layer 75, and the contact plug 79 may be formed on a substrate 21.

Referring to FIG. 5, the first sub-fin 31 may include a first side surface 31A and a second side surface 31B opposite the first side surface 31A. The second portion 26B of the device isolation layer 26 may be in contact with the first side surface 31A. The first portion 26A of the device isolation layer 26 may be in contact with the second side surface 31B. An upper end of the first sub-fin 31 may protrude to a higher level than the device isolation layer 26. An uppermost contact point of the second portion 26B of the device isolation layer 26 and the first side surface 31A may be formed at a lower level than an uppermost contact point of the first portion 26A of the device isolation layer 26 and the second side surface 31B.

Referring to FIG. 6, the gate electrode 63 may include first portions 63A and a second portion 63B. The first portions 63A may be formed between the N sub-fins 31, 32, 33, 34, 35, and 36. A lower end of each first portion 63A may extend to a lower level than upper ends of the N sub-fins 31, 32, 33, 34, 35, and 36. The second portion 63B may be formed on an outer side of the multi-fin active region 30. A lower end of the second portion 63B may extend to a lower level than an upper end of the multi-fin active region 30. The lower end of the second portion 63B may be formed at a lower level than that of each first portions 63A.

FIG. 1 is a cross-sectional view taken along line I-I' of FIG. 2, FIG. 3 is a cross-sectional view taken along line II-II' of FIG. 2, and FIG. 4 is a cross-sectional view taken along line III-III' of FIG. 2. The semiconductor device according to an exemplary embodiment of the inventive concept may be an input/output (I/O) device or a diode.

Referring again to FIGS. 1 to 6, the substrate 21 may be a semiconductor substrate such as a silicon wafer or silicon-on-insulator (SOI) wafer. For example, the substrate 21 may be a single crystalline silicon wafer including P-type impurities. The well 23 may be formed on the substrate 21. For example, the well 23 may be a semiconductor layer including P-type impurities. In an exemplary embodiment of the inventive concept, the well 23 may be a semiconductor layer including N-type impurities.

The device isolation layer 26 may include an insulating layer having silicon oxide, silicon nitride, silicon oxynitride, or a combination thereof. The first portions 26A of the device isolation layer 26 may be formed between the N sub-fins 31, 32, 33, 34, 35, and 36 of the multi-fin active region 30. The second portion 26B of the device isolation layer 26 may be formed on an outer side of the multi-fin active region 30. A lower end of the second portion 26B may be formed at a lower level than a lower end of the first portion 26A. An upper end of the second portion 26B may be formed at a lower level than an upper end of the first portion 26A. A horizontal width of the second portion 26B may be greater than that of the first portion 26A.

The multi-fin active region 30 may be defined on the well 23 by the device isolation layer 26. The multi-fin active region 30 may be a semiconductor layer including impurities having the same conductive type as the well 23. For example, the N sub-fins 31, 32, 33, 34, 35, and 36 may each be a silicon layer including P-type impurities. In an exemplary embodiment of the inventive concept, the N sub-fins 31, 32, 33, 34, 35, and 36 may each be a silicon layer including N-type impurities.

The N sub-fins 31, 32, 33, 34, 35, and 36 may each be in a line shape or bar shape in a top view. The N sub-fins 31, 32, 33, 34, 35, and 36 may each have a greater vertical height than a horizontal width in a cross-sectional view. The N sub-fins 31, 32, 33, 34, 35, and 36 may be in parallel with each other. The first sub-fin 31 and the $N^{th}$ sub-fin 36 may be formed at an outermost portion of the multi-fin active region 30. In other words, the first sub-fin 31 and the $N^{th}$ sub-fin 36 may be formed at an edge of the multi-fin active region 30. The second to $(N-1)^{th}$ sub-fins 32 to 35 may be sequentially formed between the first and $N^{th}$ sub-fins 31 and 36. The N sub-fins 31, 32, 33, 34, 35, and 36 may each protrude to a higher level than the device isolation layer 26.

The spacers 41 may be formed on side surfaces of each gate electrode 63. The spacers 41 may each include an insulating layer having silicon oxide, silicon nitride, silicon oxynitride, or a combination thereof. For example, the spacers 41 may each have silicon nitride.

The first lower insulating layer 43 may be formed on the device isolation layer 26 and the N sub-fins 31, 32, 33, 34, 35, and 36. The drain trench 44T passing through the first lower insulating layer 43 may be formed. The second to $(N-1)^{th}$ sub-fins 32 to 35 may be exposed in the drain trench 44T. The SEG patterns 52, 53, 54, and 55 may be formed on the second to $(N-1)^{th}$ sub-fins 32 to 35. The etch stop layer 57 may be formed on the SEG patterns 52, 53, 54, and 55. The second lower insulating layer 58 filling the drain trench 44T may be formed on the etch stop layer 57. Upper ends of the gate electrodes 63, the spacers 41, the first lower insulating layer 43, the etch stop layer 57, and the second lower insulating layer 58 may be substantially coplanar.

The first and $N^{th}$ sub-fins 31 and 36 may be located outside of the drain trench 44T. The first and $N^{th}$ sub-fins 31 and 36 may be covered by the first lower insulating layer 43. The spacers 41 may remain between the first lower insulating layer 43 and the first sub-fin 31, between the first lower insulating layer 43 and the $N^{th}$ sub-fin 36, and between the first lower insulating layer 43 and the device isolation layer 26.

The first lower insulating layer 43, the etch stop layer 57, and the second lower insulating layer 58 may each include an insulating layer having silicon oxide, silicon nitride, silicon oxynitride, or a combination thereof. The etch stop layer 57 may include a material having an etch selectivity with respect to the first lower insulating layer 43 and the second lower insulating layer 58. For example, the first lower insulating layer 43 and the second lower insulating layer 58 may have silicon oxide, and the etch stop layer 57 may have silicon nitride. The etch stop layer 57 may remain between the first lower insulating layer 43 and the second lower insulating layer 58.

Horizontal widths of the SEG patterns 52, 53, 54, and 55 may be greater than respective horizontal widths of the second to $(N-1)^{th}$ sub-fins 32, 33, 34, and 35. Side surfaces of the SEG patterns 52, 53, 54, and 55 may be in contact with each other. The first and $N^{th}$ sub-fins 31 and 36 may be spaced apart from the SEG patterns 52, 53, 54, and 55. A lower end of each of the SEG patterns 52, 53, 54, and 55 may be formed at a lower level than each upper end of the first and $N^{th}$ sub-fins 31 and 36. An upper end of each of the SEG patterns 52, 53, 54, and 55 may be formed at a higher level than each upper end of the second to $(N-1)^{th}$ sub-fins 32, 33, 34, and 35.

The SEG patterns 52, 53, 54, and 55 may include impurities having a different conductive type from the second to $(N-1)^{th}$ sub-fins 32 to 35. The SEG patterns 52, 53, 54, and 55 may be used as source/drains or source/drain regions. The SEG patterns 52, 53, 54, and 55 may be used as stressors or stress inducing patterns.

For example, the second to $(N-1)^{th}$ sub-fins 32 to 35 may include P-type impurities, the SEG patterns 52, 53, 54, and 55 may include N-type impurities, and the SEG patterns 52, 53, 54, and 55 may include a SiC layer, a Si layer, or a combination thereof. In an exemplary embodiment of the inventive concept, the second to $(N-1)^{th}$ sub-fins 32 to 35 may include N-type impurities, the SEG patterns 52, 53, 54, and 55 may include P-type impurities, and the SEG patterns 52, 53, 54, and 55 may include a SiGe layer, a Si layer, or a combination thereof. Further, in an exemplary embodiment of the inventive concept, the SEG patterns 52, 53, 54, and 55 may include a semiconductor layer formed by crystal-growth in another method.

The gate electrodes 63 may cross the multi-fin active region 30 and extend onto the device isolation layer 26. The lower gate dielectric layer 61 may be formed between the N sub-fins 31, 32, 33, 34, 35, and 36 and the gate electrodes 63. The upper gate dielectric layer 62 may be formed on the lower gate dielectric layer 61. The lower gate dielectric layer 61 may be in direct contact with side surfaces and upper surfaces of the first to $N^{th}$ sub-fins 31 to 36. The upper gate dielectric layer 62 may be in direct contact with a bottom and side surfaces of each gate electrode 63. The upper gate dielectric layer 62 may extend between the gate electrodes 63 and the spacers 41.

The lower gate dielectric layer 61 may include a chemical oxide formed by a cleaning process. The lower gate dielectric layer 61 may include a silicon oxide formed by the reaction of H2O2 and Si. The lower gate dielectric layer 61 may be referred to as an interfacial oxide. The upper gate dielectric layer 62 may include high-k dielectrics. The gate electrode 63 may include a work-function metal layer and a conductive layer.

Upper ends of the gate electrodes 63, the upper gate dielectric layer 62, the spacer 41, the first lower insulating layer 43, the etch stop layer 57, and the second lower insulating layer 58 may be substantially coplanar. The upper insulating layer 71 may be formed on the gate electrodes 63, the upper gate dielectric layer 62, the spacers 41, the first lower insulating layer 43, the etch stop layer 57, and the second lower insulating layer 58. The upper insulating layer 71 may include an insulating layer having silicon oxide, silicon nitride, silicon oxynitride, or a combination thereof.

The contact plugs 79, which pass through the upper insulating layer 71, the second lower insulating layer 58, and the etch stop layer 57 and are in contact with the SEG patterns 52, 53, 54, and 55, may be formed. The barrier layer 76 may surround a bottom and side surfaces of the conductive layer 77. The barrier layer 76 may include Ti, TiN, Ta, TaN, or a combination thereof. The conductive layer 77 may include W, WN, Ru, Al, Cu, a conductive carbon, or a combination thereof.

The metal silicide layer 75 may be formed between the SEG patterns 52, 53, 54, and 55 and the contact plugs 79. The metal silicide layer 75 may be selectively formed on surfaces of the SEG patterns 52, 53, 54, and 55. The metal silicide layer 75 may be disposed on lower ends of the contact plugs 79. The metal silicide layer 75 may be selectively formed on the second to $(N-1)^{th}$ sub-fins 32 to 35. The metal silicide layer 75 may not be formed on the first and $N^{th}$ sub-fins 31 and 36. The contact plugs 79 may be in direct contact with the metal silicide layer 75. For example, the barrier layer 76 may directly contact the metal silicide layer 75.

The contact plugs 79 may be electrically connected to the second to $(N-1)^{th}$ sub-fins 32 to 35, and the contact plugs 79 are not electrically connected to the first and $N^{th}$ sub-fins 31 and 36. The first and $N^{th}$ sub-fins 31 and 36 may be spaced apart from the contact plugs 79. The first and $N^{th}$ sub-fins 31 and 36 may be used as inactive-fins, and the second to $(N-1)^{th}$ sub-fins 32 to 35 may be used as active-fins.

Figure 9:
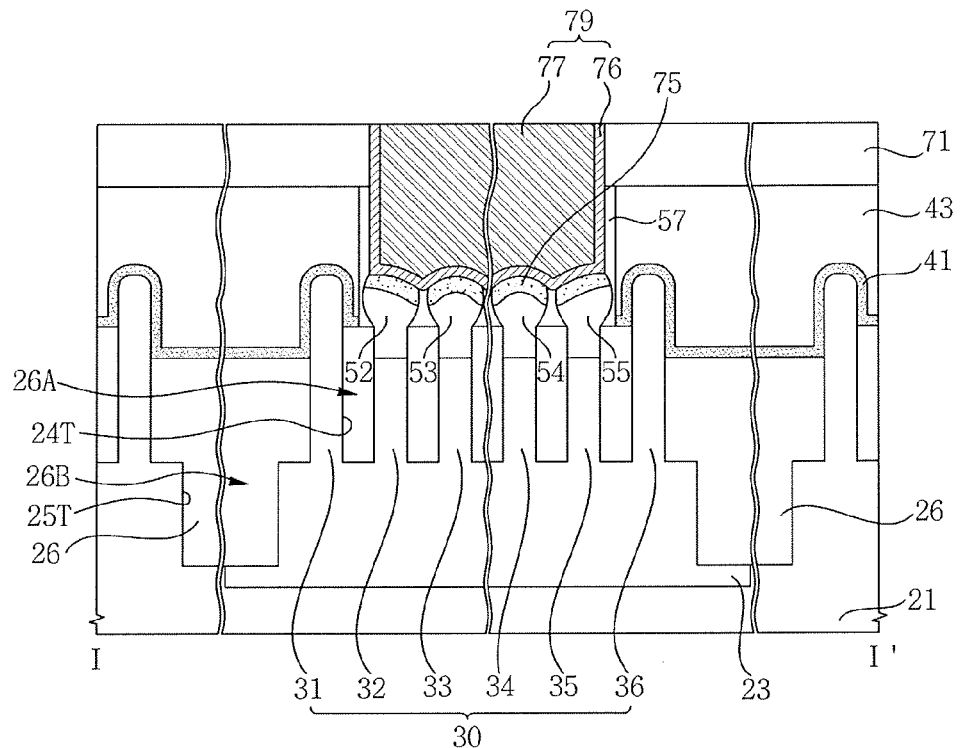
Figure 10:
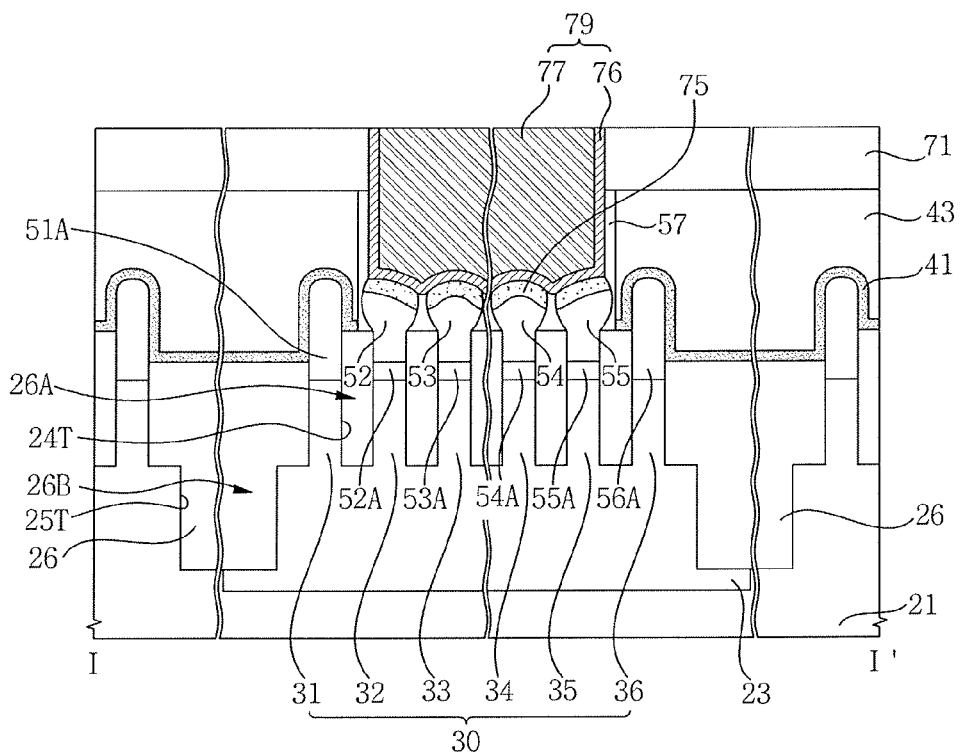
Figure 11:
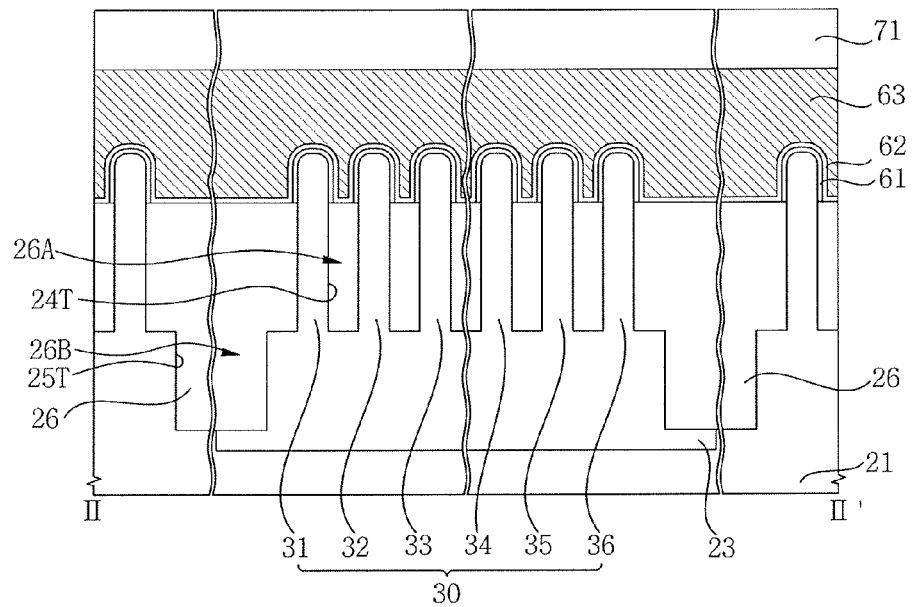
Figure 12:
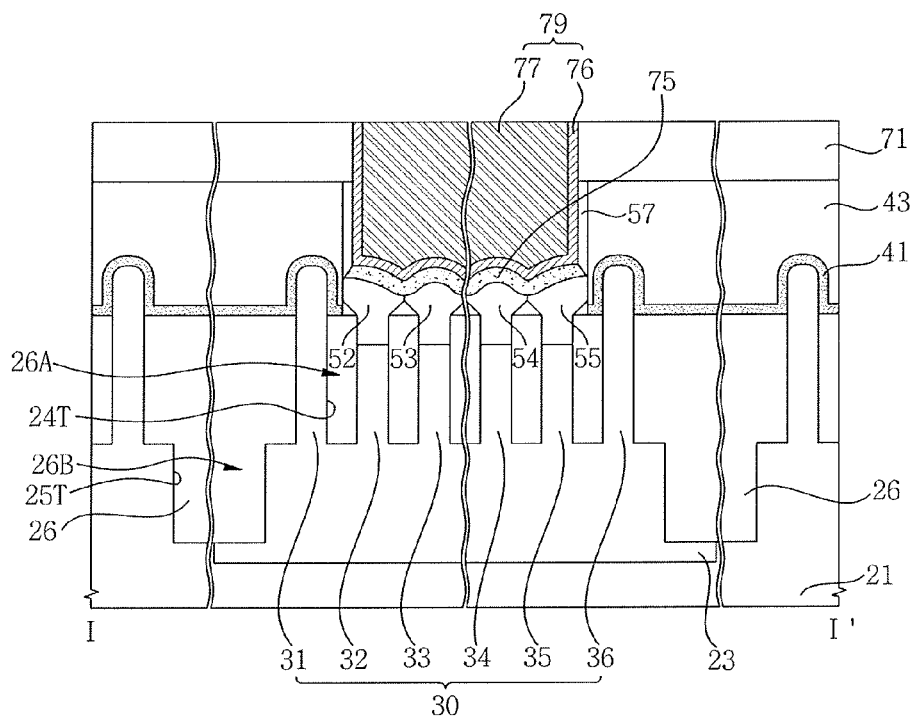
Figure 13:
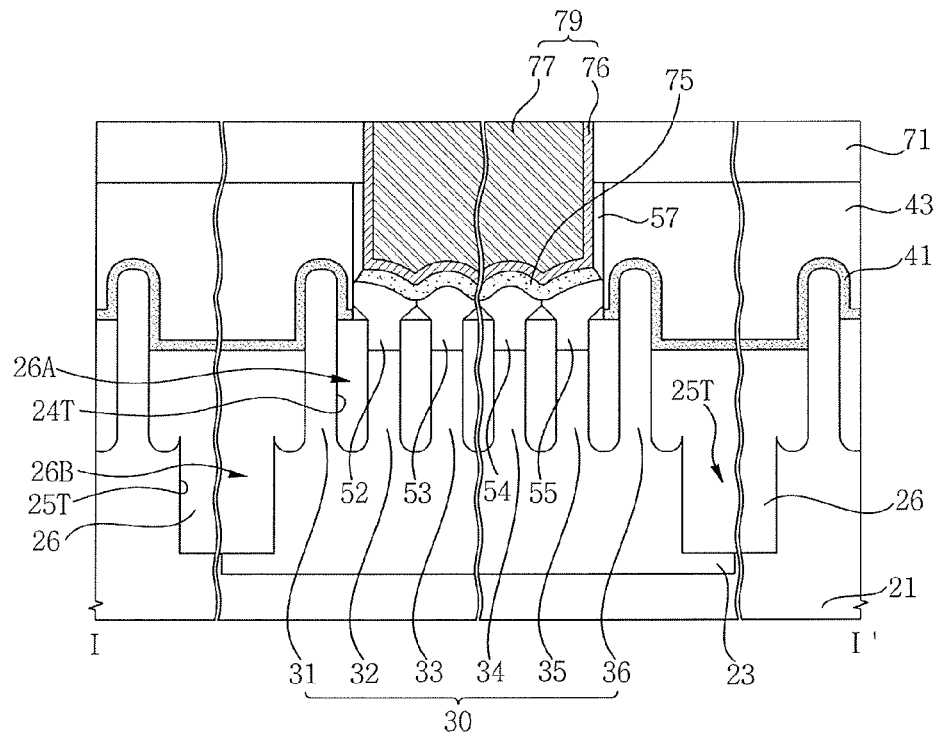
Figure 14:
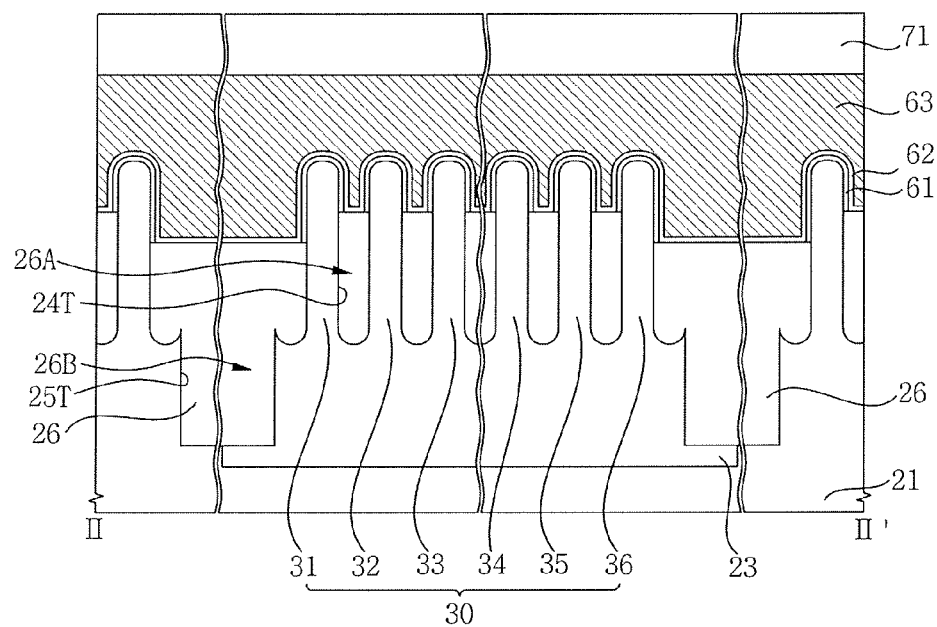

FIGS. 7 to 10, 12, 13, and 15 are cross-sectional views taken along line I-I' of FIG. 2 for describing a semiconductor device according to an exemplary embodiment of the inventive concept, and FIGS. 11 and 14 are cross-sectional views taken along line II-II' of FIG. 2 for describing a semiconductor device according to an exemplary embodiment of the inventive concept.

Figure 7:
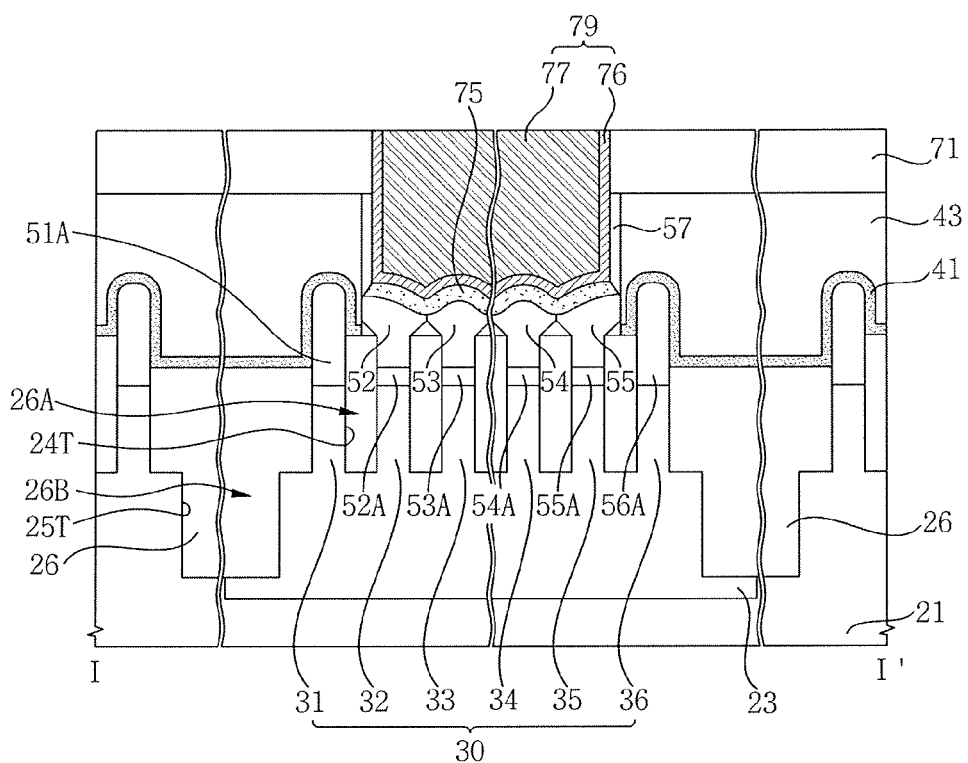
FIGS. 7, 8, 9, 10, 11, 12, 13, 14 and 15 are cross-sectional views for describing a semiconductor device according to an exemplary embodiment of the inventive concept.

Referring to FIG. 7, impurity regions 51A, 52A, 53A, 54A, 55A, and 56A may be formed on the N sub-fins 31, 32, 33, 34, 35, and 36. The impurity regions 51A, 52A, 53A, 54A, 55A, and 56A may include impurities having a different conductive type from the well 23.

The impurity regions 51A, 52A, 53A, 54A, 55A, and 56A may include a first impurity region 51A, a second impurity region 52A, a third impurity region 53A, a fourth impurity region 54A, a fifth impurity region 55A, and a sixth impurity region 56A. The second to fifth impurity regions 52A to 55A may include impurities having the same conductive type as the SEG patterns 52, 53, 54, and 55. The second to fifth impurity regions 52A to 55A and the SEG patterns 52, 53, 54, and 55 may be used as source/drains or source/drain regions. The first impurity region 51A disposed on the first sub-fin 31 and the sixth impurity region 56A disposed on the $N^{th}$ sub-fin 36 are not electrically connected to the contact plugs 79. The first impurity region 51A disposed on the first sub-fin 31 and the sixth impurity region 56A disposed on the $N^{th}$ sub-fin 36 may be spaced apart from the contact plugs 79.

Figure 8:
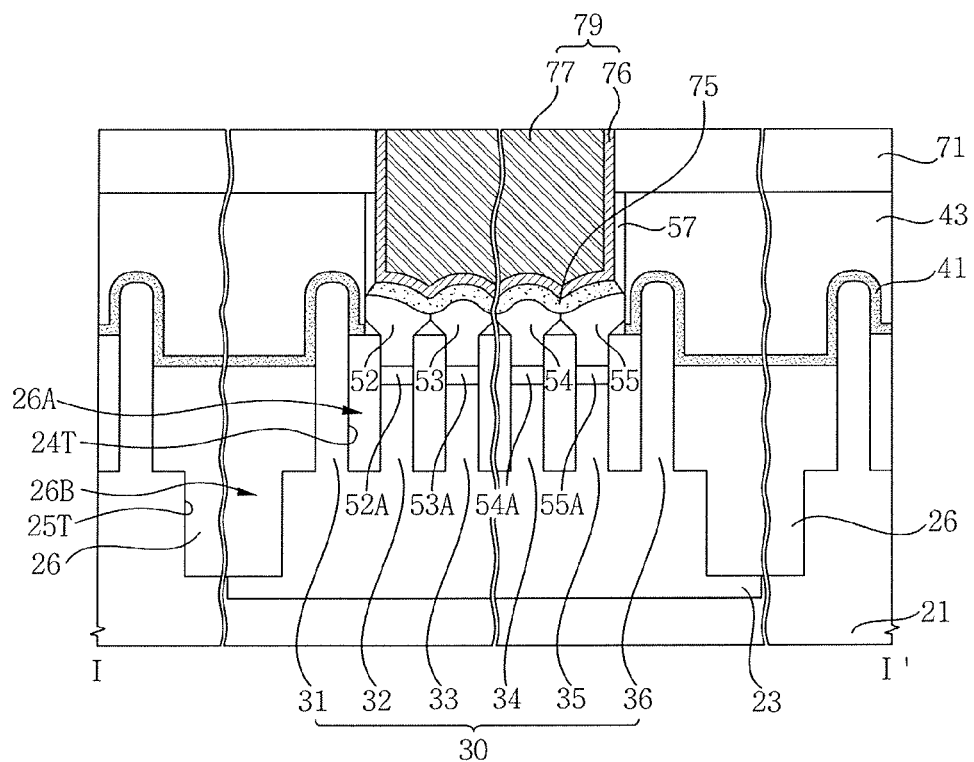

Referring to FIG. 8, the first and $N^{th}$ sub-fins 31 and 36 may include impurities having the same conductive type as the well 23. The impurity regions 52A, 53A, 54A, and 55A may be formed on the second sub-fin 32, the third sub-fin 33, the $(N-2)^{th}$ sub-fin 34, and the $(N-1)^{th}$ sub-fin 35. The impurity regions 52A, 53A, 54A, and 55A may be spaced apart from the first sub-fin 31 and the $N^{th}$ sub-fin 36.

Referring to FIG. 9, the SEG patterns 52, 53, 54, and 55 may be spaced apart from each other. In other words, the SEG patterns 52, 53, 54, and 55 may not contact each other.

Referring to FIG. 10, the SEG patterns 52, 53, 54, and 55 may be spaced apart from each other. In other words, the SEG patterns 52, 53, 54, and 55 may not contact each other. The impurity regions 51A, 52A, 53A, 54A, 55A, and 56A may be formed on the N sub-fins 31, 32, 33, 34, 35, and 36.

Referring to FIGS. 11 and 12, the device isolation layer 26 may include the first portions 26A and the second portion 26B. Upper surfaces of the first portions 26A and an upper surface of the second portion 26B may be formed at substantially the same level.

Referring to FIGS. 13 and 14, the device isolation layer 26 may include the first portions 26A and the second portion 26B. Lower ends of the first portions 26A may be rounded.

Figure 15:
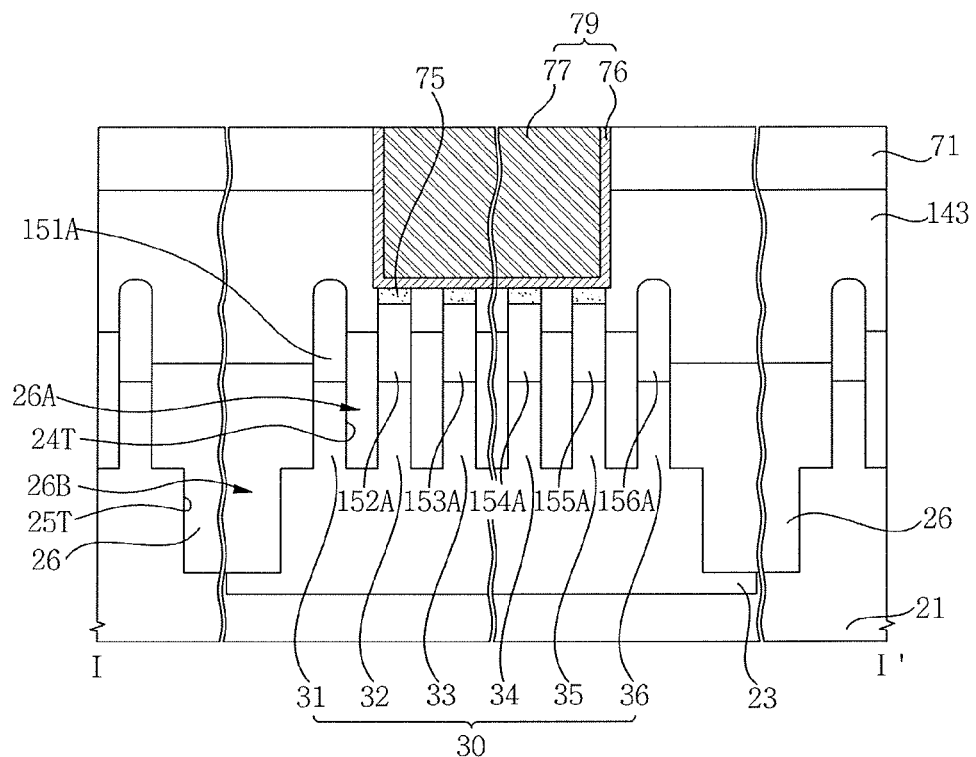

Referring to FIG. 15, impurity regions 151A, 152A, 153A, 154A, 155A, and 156A may be formed on the N sub-fins 31, 32, 33, 34, 35, and 36. The metal silicide layer 75 may be formed on the second to $(N-1)^{th}$ sub-fins 32 to 35. The N sub-fins 31, 32, 33, 34, 35, and 36 may be covered by a first lower insulating layer 143. The impurity regions 151A, 152A, 153A, 154A, 155A, and 156A may include a first impurity region 151A, a second impurity region 152A, a third impurity region 153A, a fourth impurity region 154A, a fifth impurity region 155A, and a sixth impurity region 156A. The metal silicide layer 75 may be formed between the second to fifth impurity regions 152A to 155A and the contact plugs 79.

Figure 16:
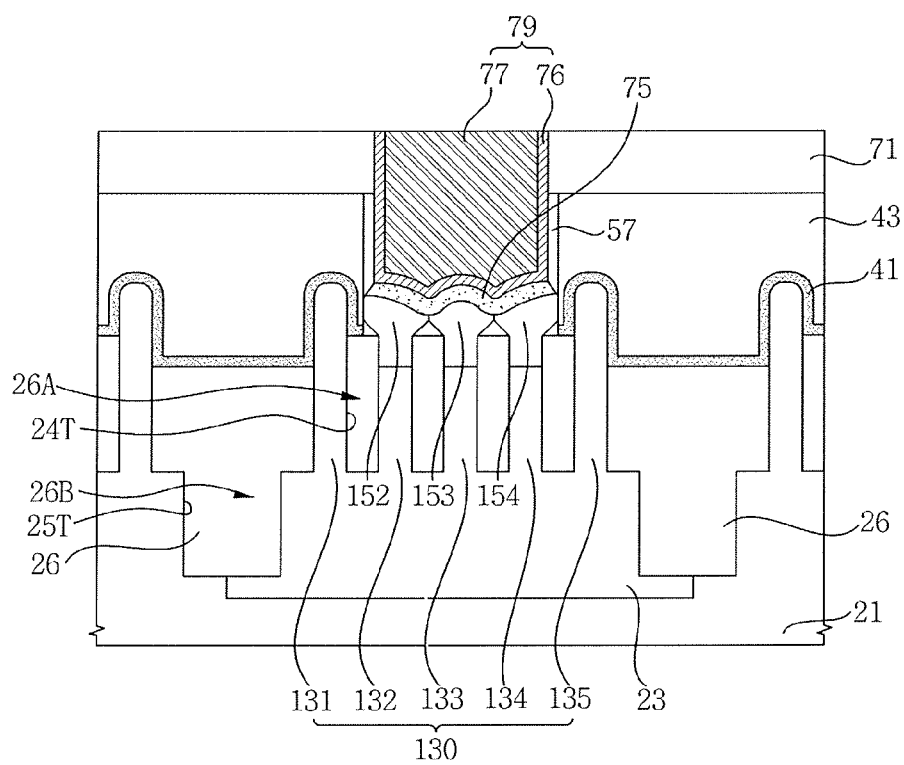
FIGS. 16 and 17 are cross-sectional views for describing a semiconductor device according to an exemplary embodiment of the inventive concept.
Figure 17:
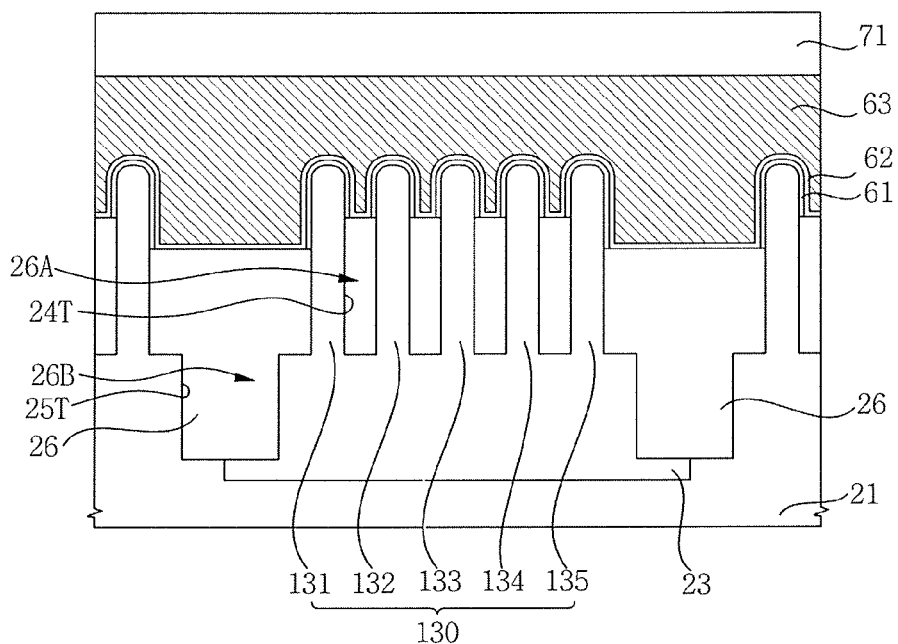
Figure 18:
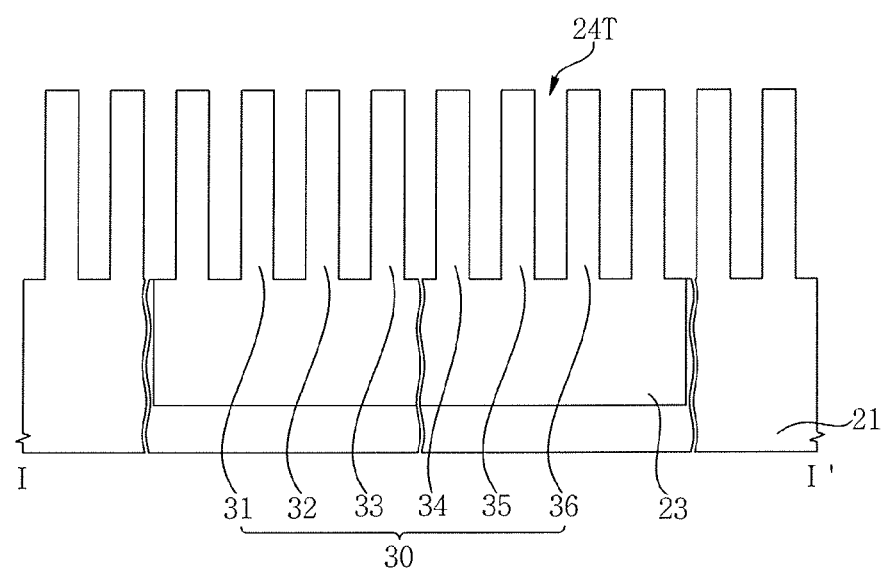
FIGS. 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49 and 50 are cross-sectional views for describing a method of manufacturing a semiconductor device according to an exemplary embodiment of the inventive concept.
Figure 19:
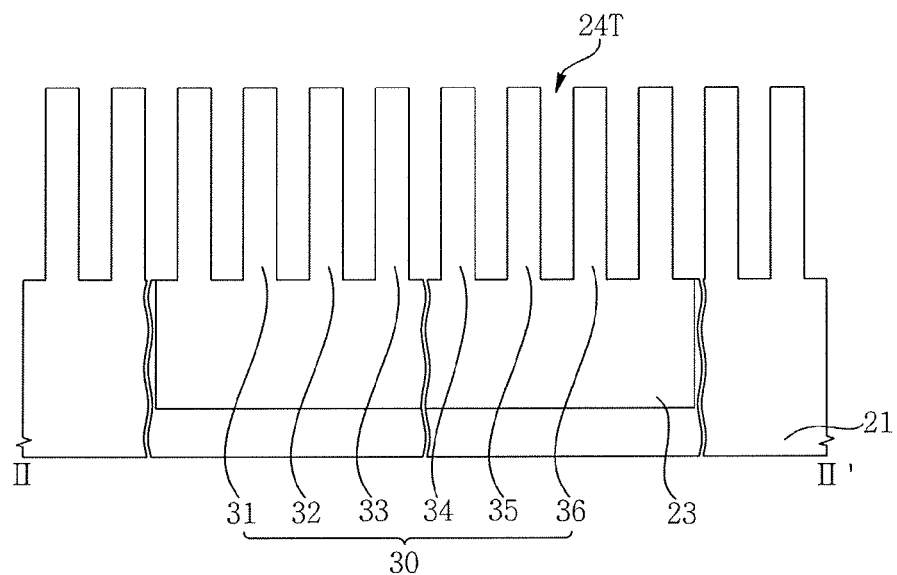
Figure 20:
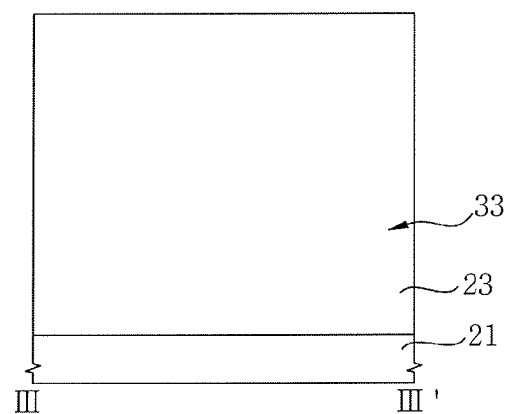

FIGS. 16 and 17 are cross-sectional views for describing a semiconductor device according to an exemplary embodiment of the inventive concept.

Referring to FIGS. 16 and 17, a well 23, first trenches 24T, second trenches 25T, a device isolation layer 26, a multi-fin active region 130, SEG patterns 152, 153, and 154, spacers 41, a first lower insulating layer 43, an etch stop layer 57, a lower gate dielectric layer 61, an upper gate dielectric layer 62, a gate electrode 63, an upper insulating layer 71, a metal silicide layer 75, and a contact plug 79 may be formed on a substrate 21.

The device isolation layer 26 may include first portions 26A and second portions 26B. The multi-fin active region 130 may include a first sub-fin 131, a second sub-fin 132, a third sub-fin 133, a fourth sub-fin 134, and a fifth sub-fin 135. The contact plug 79 may include a barrier layer 76 and a conductive layer 77. The SEG patterns 152, 153, and 154 may include a first SEG pattern 152, a second SEG pattern 153, and a third SEG pattern 154.

FIGS. 18, 21, 23, 25, 28, 31, 34, 37, 39, 46, and 48 are cross-sectional views taken along line I-I' of FIG. 2 for describing a method of manufacturing a semiconductor device according to an exemplary embodiment of the inventive concept, FIGS. 19, 22, 24, 26, 29, 32, 35, 40, 42, 44, and 49 are cross-sectional views taken along line II-II' of FIG. 2 for describing a method of manufacturing a semiconductor device according to an exemplary embodiment of the inventive concept, and FIGS. 20, 27, 30, 33, 36, 38, 41, 43, 45, 47, and 50 are cross-sectional views taken along line III-III' of FIG. 2 for describing a method of manufacturing a semiconductor device according to an exemplary embodiment of the inventive concept.

Referring to FIGS. 2, 18, 19, and 20, the well 23, the first trenches 24T, and the multi-fin active region 30 may be formed on the substrate 21. The multi-fin active region 30 may include the N sub-fins 31, 32, 33, 34, 35, and 36. The multi-fin active region 30 may include the first sub-fin 31, the second sub-fin 32, the third sub-fin 33, the $(N-2)^{th}$ sub-fin 34, the $(N-1)^{th}$ sub-fin 35, and the $N^{th}$ sub-fin 36. Here, N is an integer. For example, N may be an integer of 1000 or less.

Figure 21:
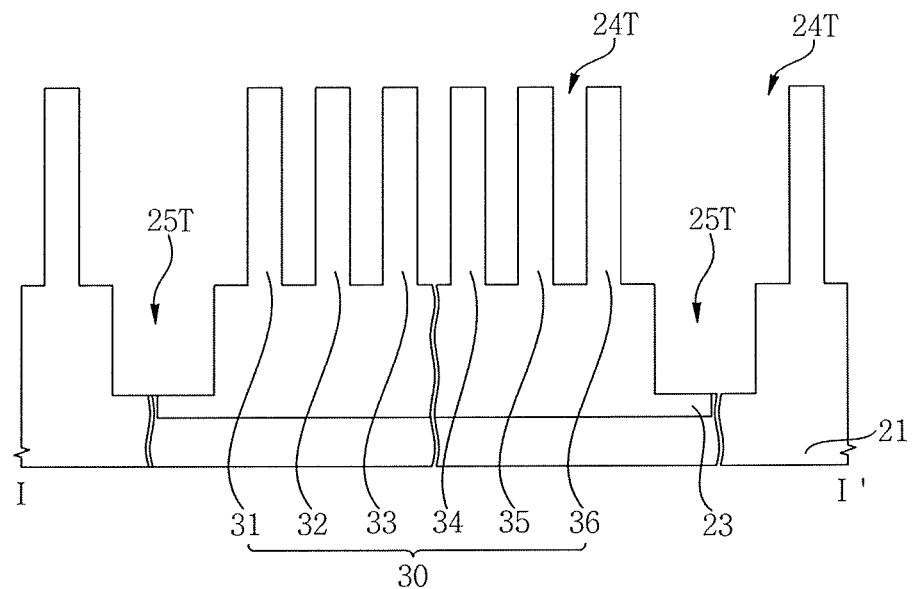
Figure 22:
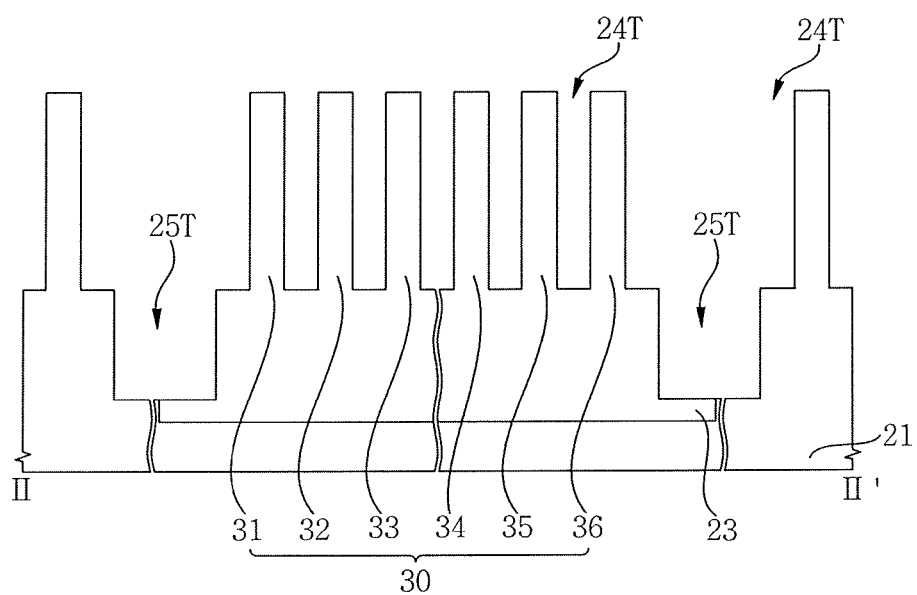

Referring to FIGS. 2, 21, and 22, the second trenches 25T may be formed on the substrate 21. The second trenches 25T may surround outer sides of the multi-fin active region 30. For example, the second trenches 25T may be disposed at edges of the multi-fin active region 30. The second trenches 25T may each have a greater horizontal width than each first trench 24T. A bottom of each second trench 25T may be formed at a lower level than that of each first trench 24T.

Figure 23:
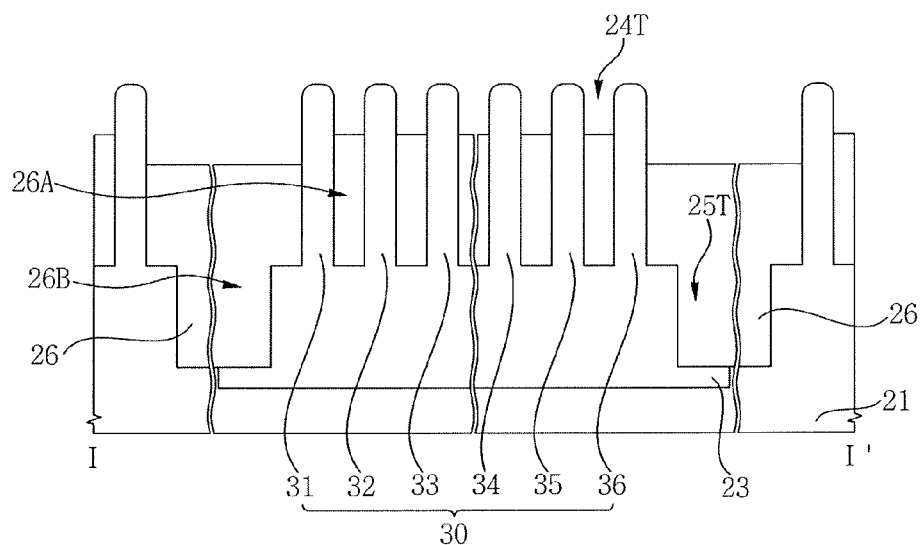
Figure 24:
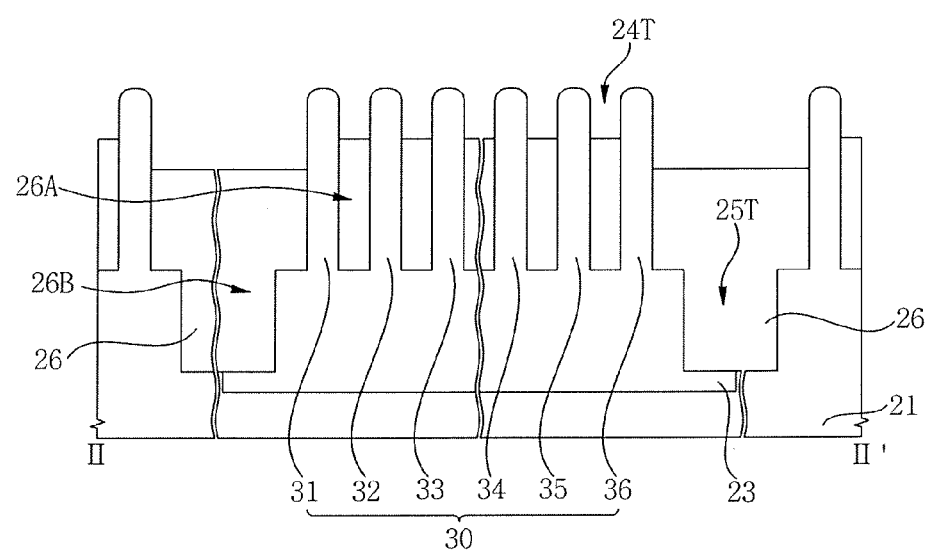
Figure 25:
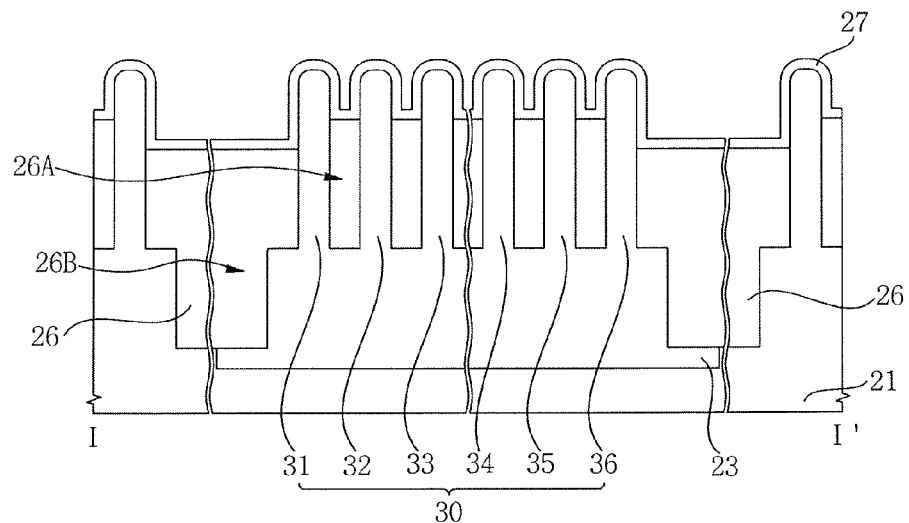
Figure 26:
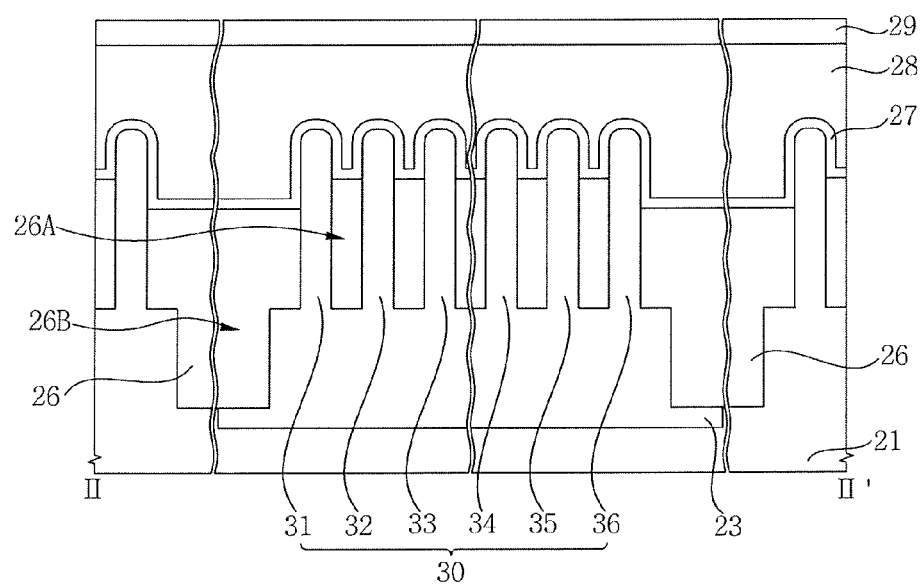
Figure 27:
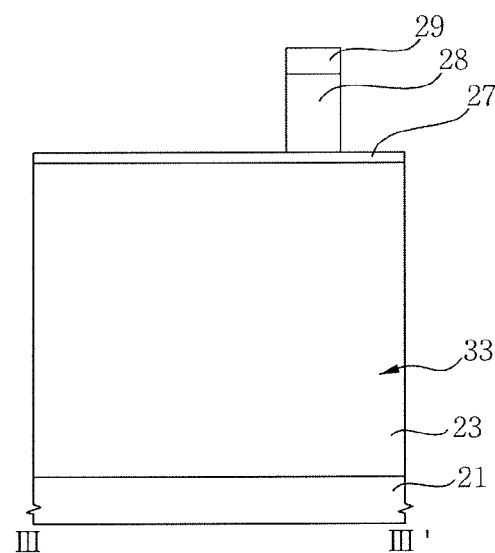
Figure 28:
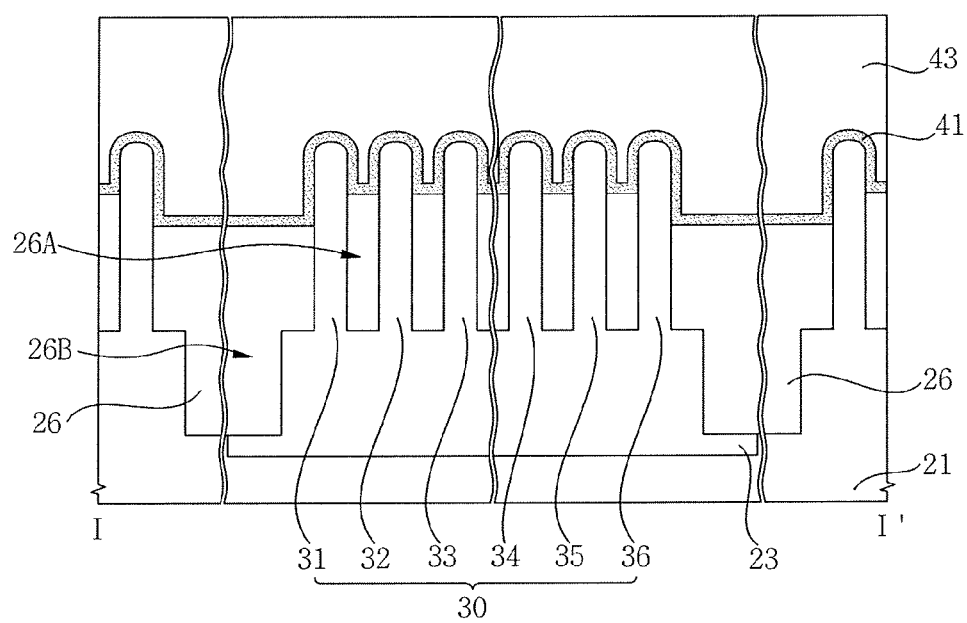
Figure 29:
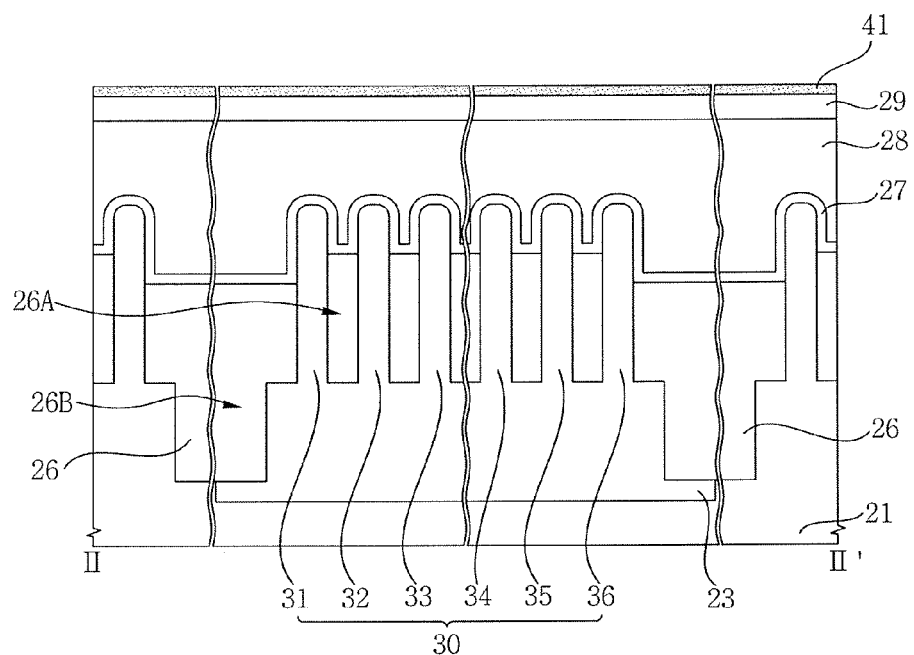
Figure 30:
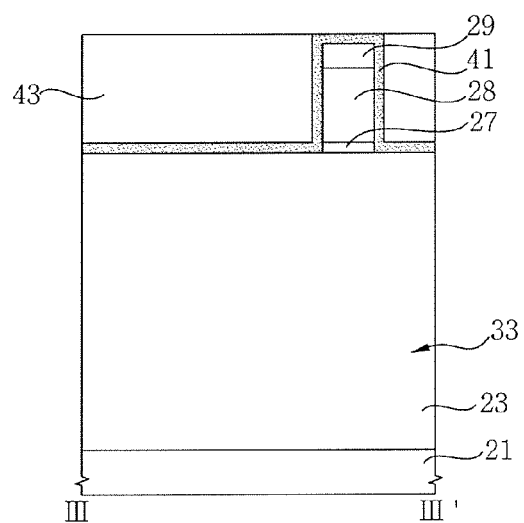
Figure 31:
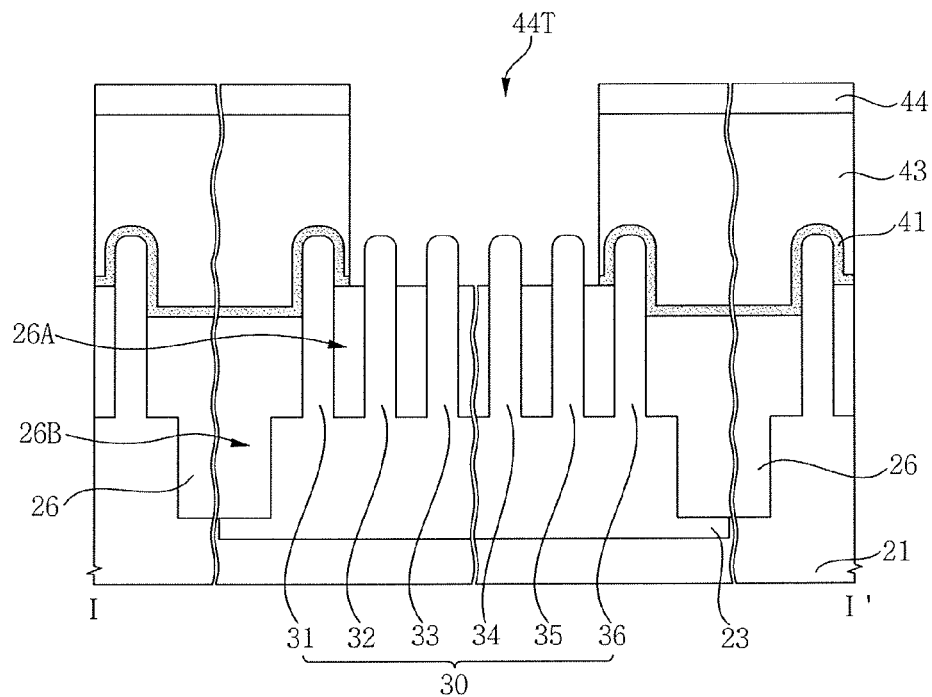
Figure 32:
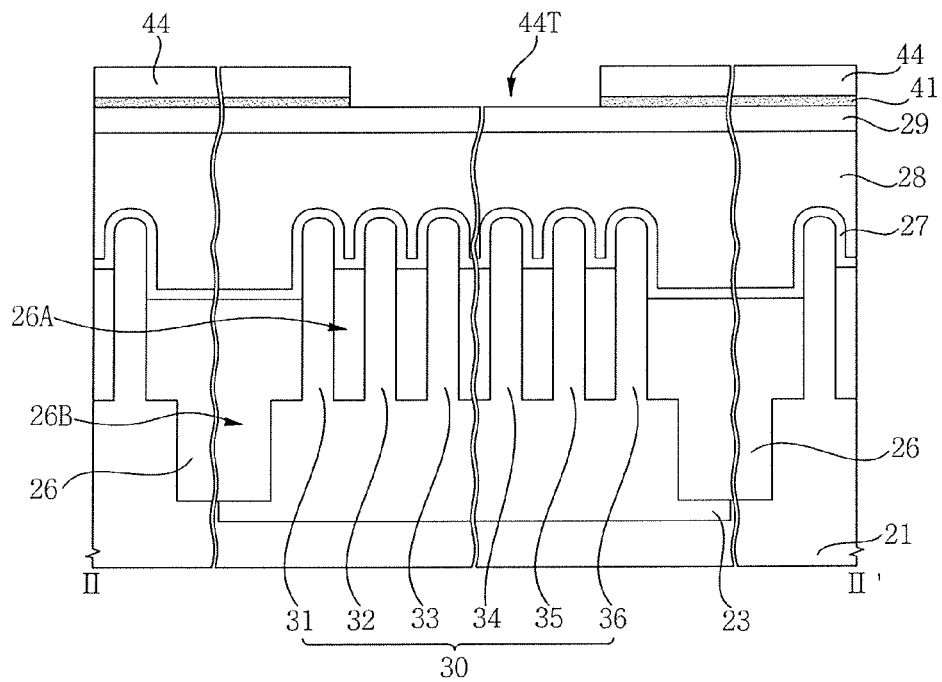
Figure 33:
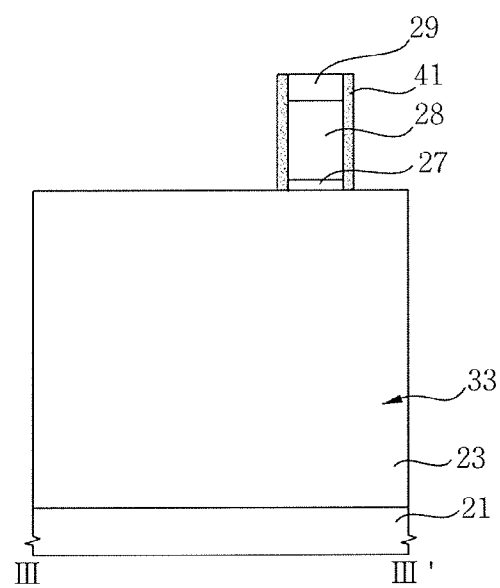
Figure 34:
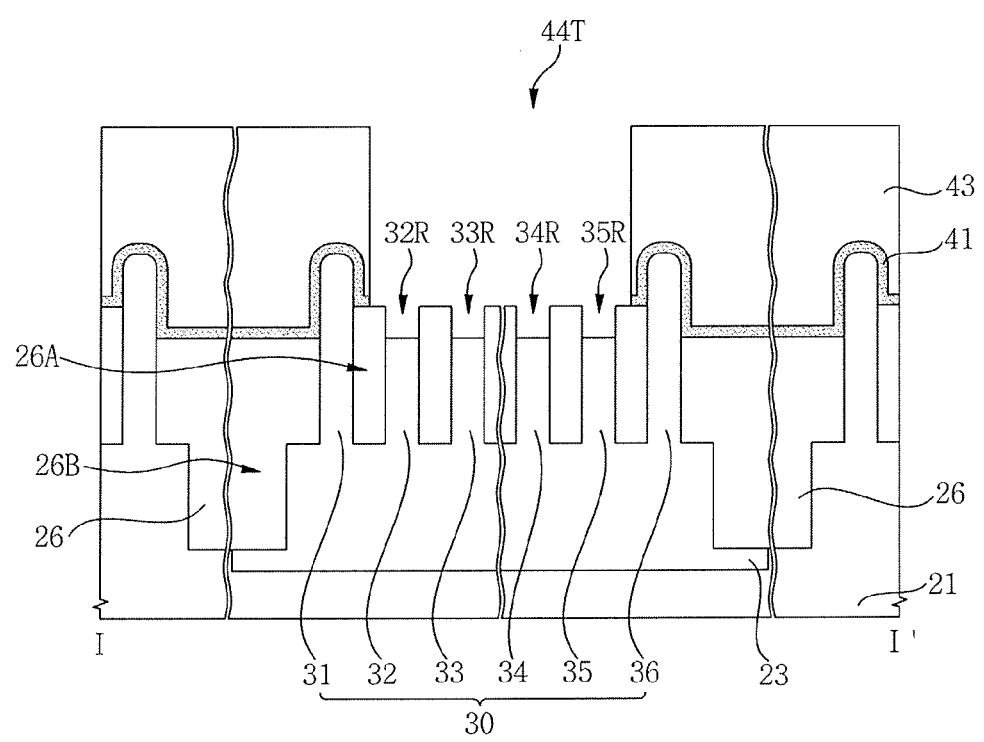
Figure 35:
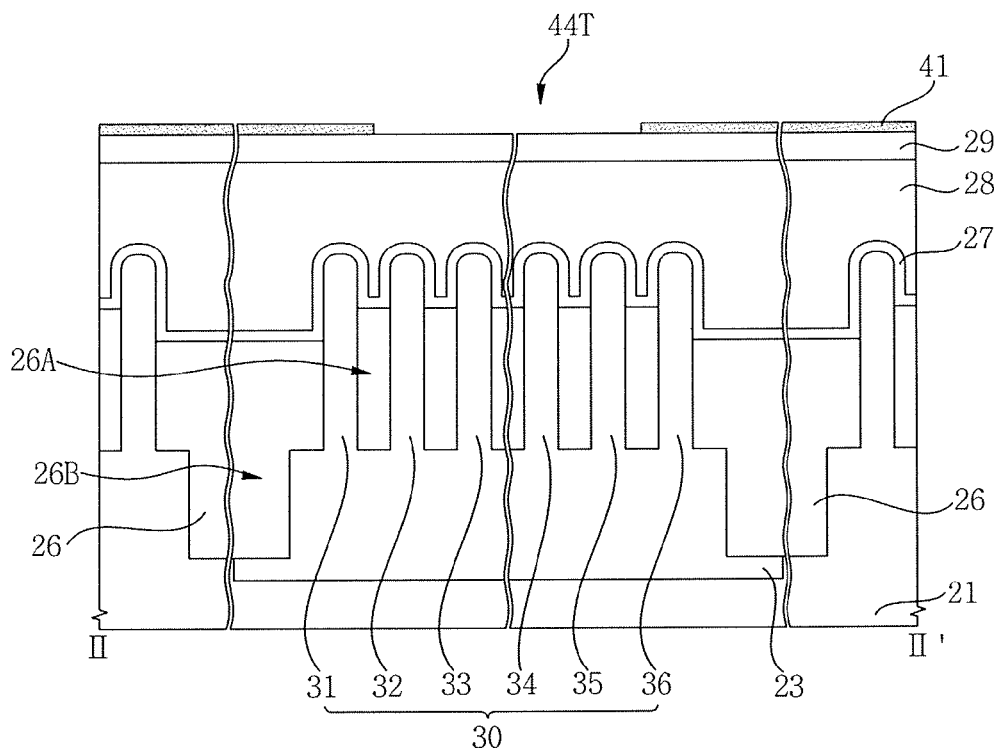
Figure 36:
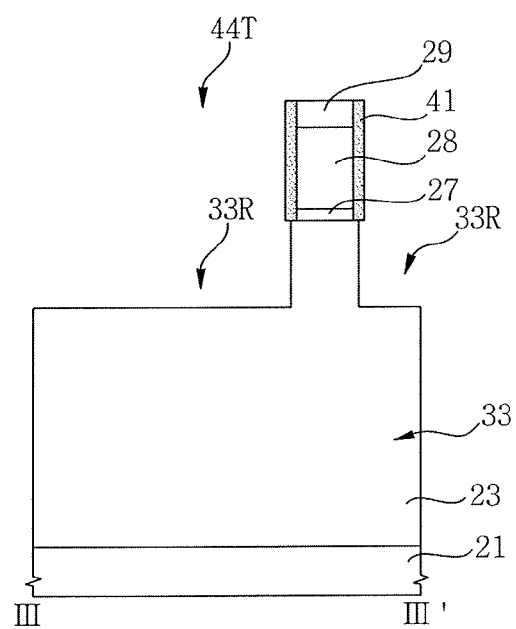

Referring to FIGS. 2, 23, and 24, the device isolation layer 26 may be formed in the first trenches 24T and the second trenches 25T. The formation of the device isolation layer 26 may include performing a thin film forming process and an etch-back process.

Upper ends of the first to $N^{th}$ sub-fins 31 to 36 may each protrude to a higher level than the device isolation layer 26. The device isolation layer 26 may include the first portions 26A and the second portion 26B. An upper end of the second portion 26B may be formed at a lower level than that of each first portion 26A. A lower end of the second portion 26B may be formed at a lower level than that of each first portion 26A. The second portion 26B may have a greater horizontal width than each first portion 26A. The upper ends of the first to $N^{th}$ sub-fins 31 to 36 may each be rounded.

Referring to FIGS. 2, 25, 26, and 27, a buffer layer 27 may be formed to cover the first to $N^{th}$ sub-fins 31 to 36 and the device isolation layer 26. A preliminary gate electrode 28 and a capping layer 29 may be formed on the buffer layer 27. The formation of the preliminary gate electrode 28 and the capping layer 29 may include performing a thin film forming process and a patterning process. The preliminary gate electrode 28 may be disposed under the capping layer 29.

The buffer layer 27 may include an insulating layer having silicon oxide. The preliminary gate electrode 28 may include polysilicon. The capping layer 29 may include an insulating layer having silicon oxide, silicon nitride, silicon oxynitride, or a combination thereof.

Referring to FIGS. 2, 28, 29, and 30, the first to $N^{th}$ sub-fins 31 to 36 may be partly exposed at both sides of the preliminary gate electrode 28 by partly removing the buffer layer 27. The buffer layer 27 may remain between the preliminary gate electrode 28 and the first to $N^{th}$ sub-fins 31 to 36 and between the preliminary gate electrode 28 and the device isolation layer 26. A spacer 41 may be formed to cover the preliminary gate electrode 28 and the capping layer 29 and the first to $N^{th}$ sub-fins 31 to 36. A first lower insulating layer 43 may be formed on the spacer 41. The formation of the first lower insulating layer 43 may include performing a thin film forming process and a planarization process. The planarization process may include a chemical mechanical polishing (CMP) process or an etch-back process.

In an exemplary embodiment of the inventive concept, before the first lower insulating layer 43 is formed, an anisotropic etching process may be performed, and the spacer 41 may remain on side surfaces of the preliminary gate electrode 28.

Referring to FIGS. 2, 31, 32, and 33, a first mask pattern 44 may be formed on the spacer 41 and the first lower insulating layer 43. The drain trench 44T may be formed using the first mask pattern 44 as an etch mask. The second to $(N-1)^{th}$ sub-fins 32 to 35 may be exposed in the drain trench 44T. The first and $N^{th}$ sub-fins 31 and 36 may be located outside of the drain trench 44T. The first and $N^{th}$ sub-fins 31 and 36 may be covered by the first lower insulating layer 43. The drain trench 44T may pass through the first lower insulating layer 43 and the spacer 41.

The first mask pattern 44 may be removed.

Referring to FIGS. 2, 34, 35, and 36, recess regions 32R, 33R, 34R, and 35R may be formed by partly removing the second to $(N-1)^{th}$ sub-fins 32 to 35. For example, tops of the second to $(N-1)^{th}$ sub-fins 32 to 35 may be removed. Bottoms of the recess regions 32R, 33R, 34R, and 35R may each be formed at a lower level than an upper end of each first portion 26A of the device isolation layer 26.

Figure 37:
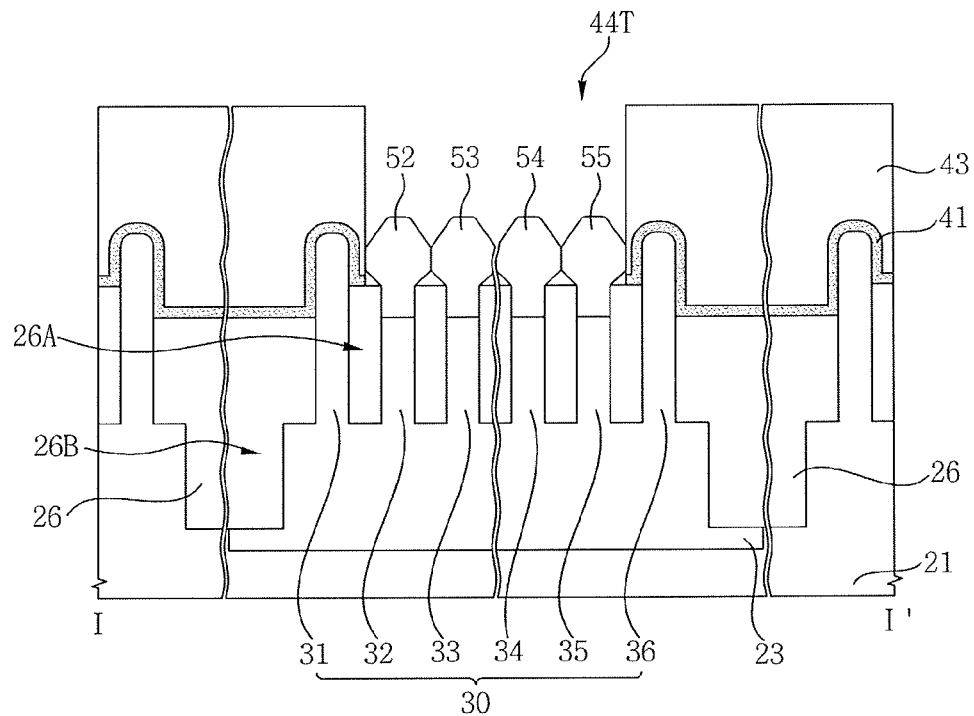
Figure 38:
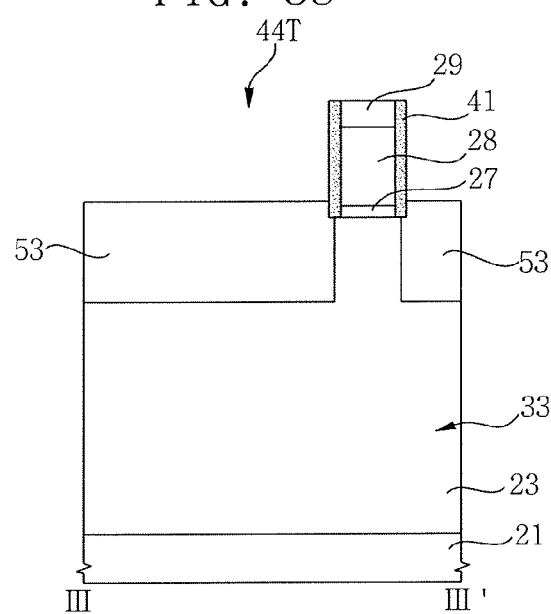
Figure 39:
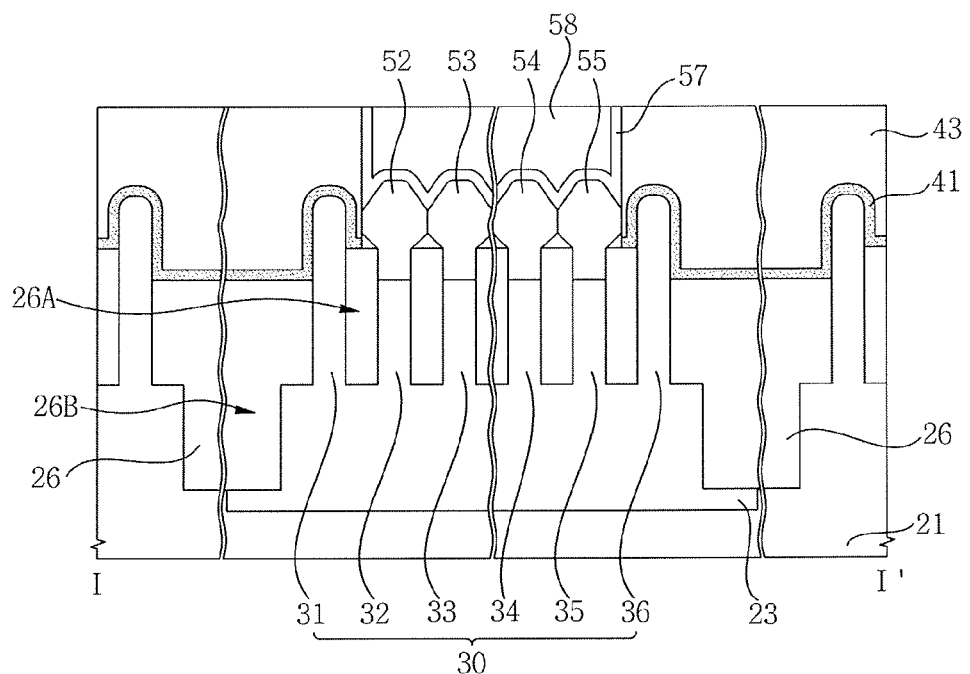
Figure 40:
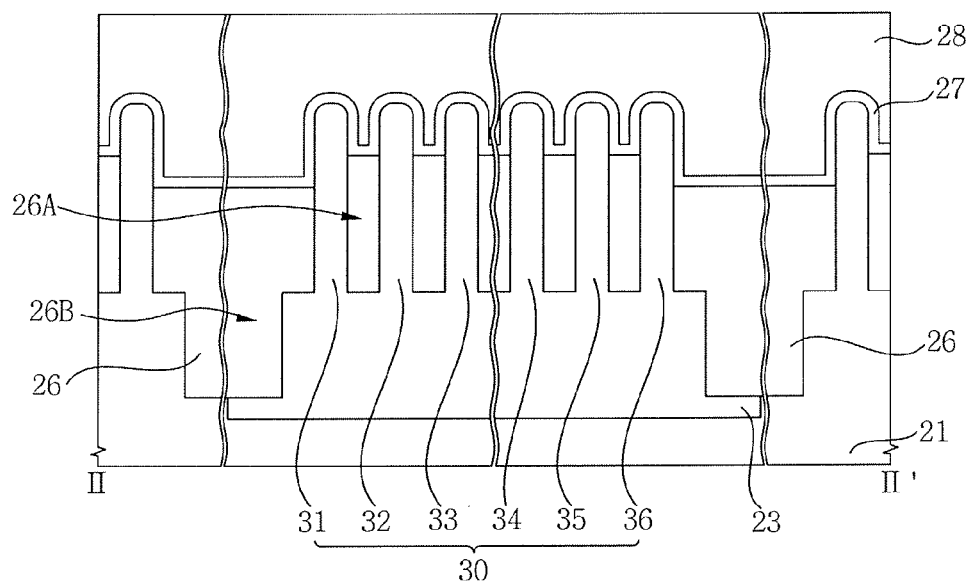
Figure 41:
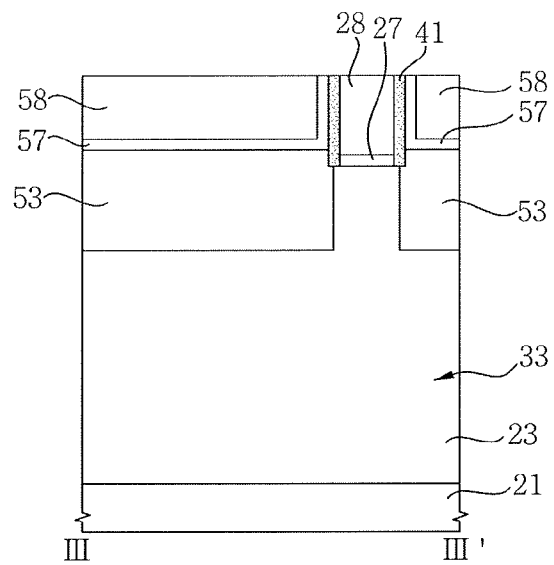

Referring to FIGS. 2, 37, and 38, the SEG patterns 52, 53, 54, and 55 may be formed in the recess regions 32R, 33R, 34R, and 35R.

Referring to FIGS. 2, 39, 40, and 41, the etch stop layer 57 may be formed on the SEG patterns 52, 53, 54, and 55. The second lower insulating layer 58 may be formed on the etch stop layer 57 to fill the drain trench 44T. The preliminary gate electrode 28 may be exposed by removing the capping layer 29. The formation of the etch stop layer 57 and the second lower insulating layer 58 may include performing a thin film forming process and a planarization process. The removing of the capping layer 29 may include performing a planarization process. The planarization process may include a CMP process or an etch-back process.

Figure 42:
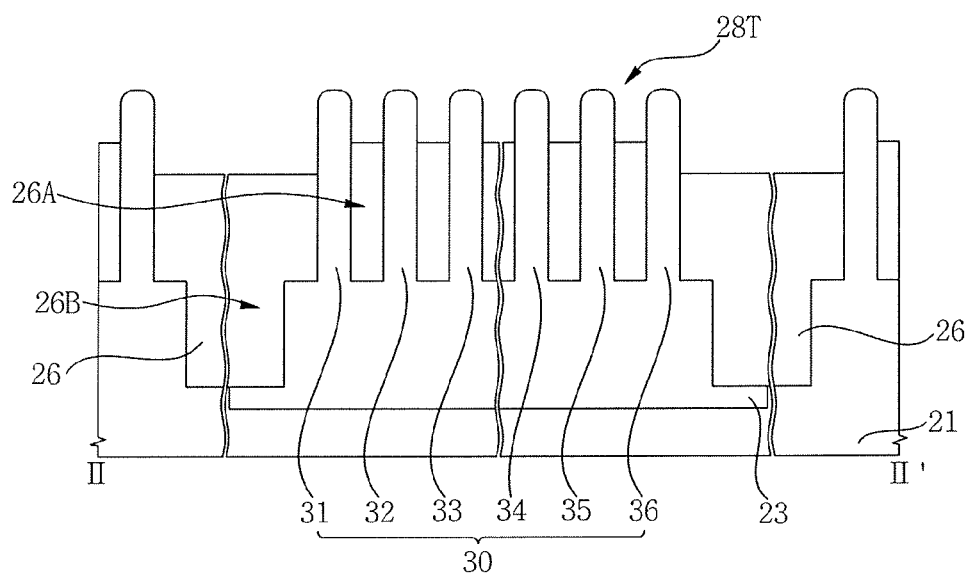
Figure 43:
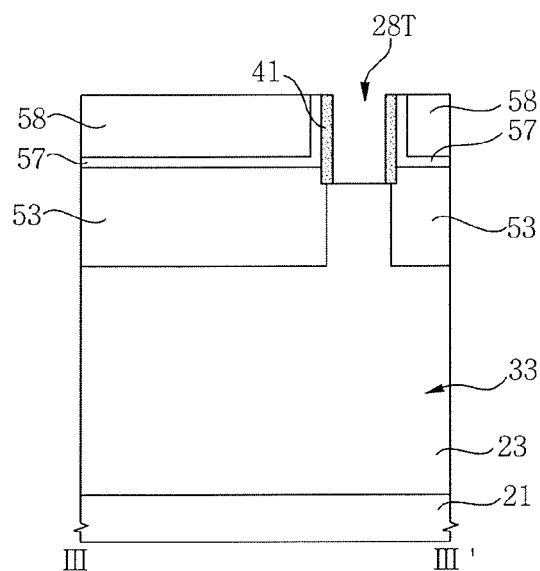

Referring to FIGS. 2, 42, and 43, a gate trench 28T may be formed by removing the preliminary gate electrode 28 and the buffer layer 27. The first to $N^{th}$ sub-fins 31 to 36 may be exposed in the gate trench 28T.

According to an exemplary embodiment of the inventive concept, when defects, such as gate poly skirts, occur in the preliminary gate electrode 28 adjacent to outer sides of the N sub-fins 31, 32, 33, 34, 35, and 36, damage to the SEG patterns 52, 53, 54, and 55 and the second to $(N-1)^{th}$ sub-fins 32 to 35 can be prevented while the preliminary gate electrode 28 is removed.

Figure 44:
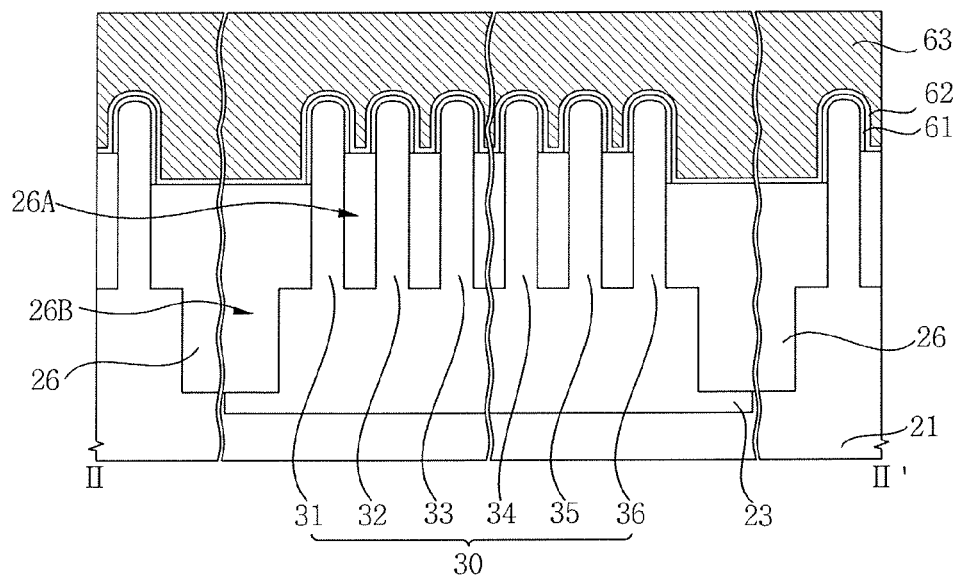
Figure 45:
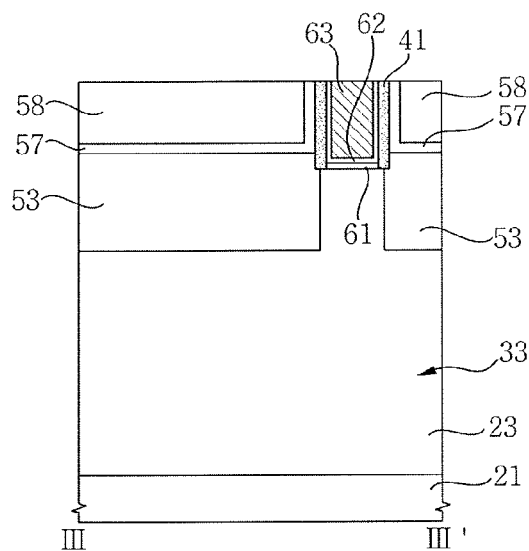

Referring to FIGS. 2, 44, and 45, the lower gate dielectric layer 61, the upper gate dielectric layer 62, and the gate electrode 63 may be formed in the gate trench 28T. The formation of the upper gate dielectric layer 62 and the gate electrode 63 may include performing a thin film forming process and a planarization process. The planarization process may include a CMP process or an etch-back process.

Figure 46:
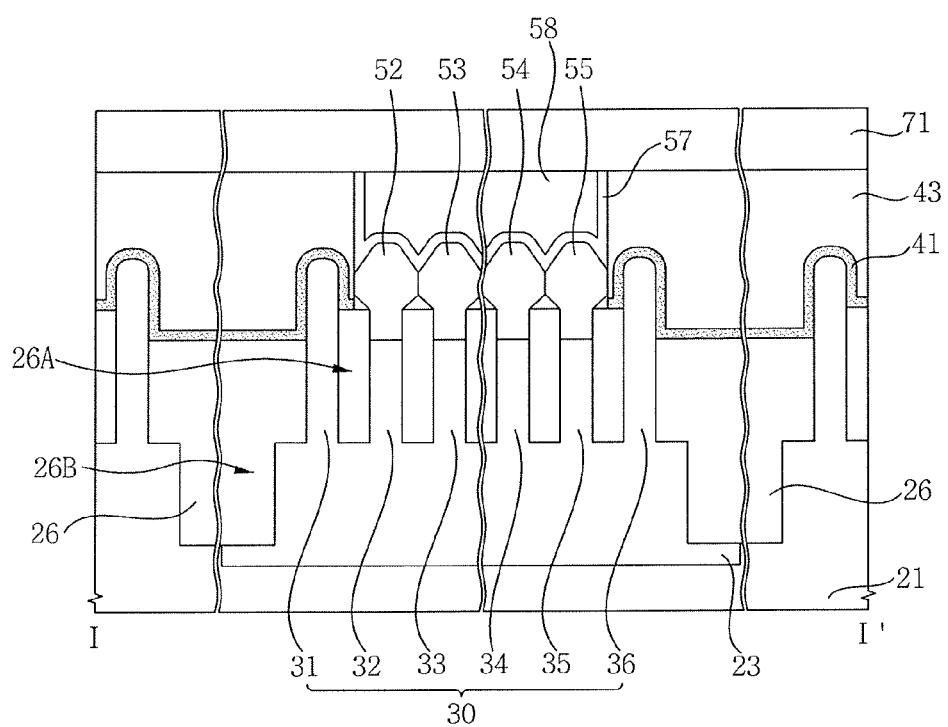
Figure 47:
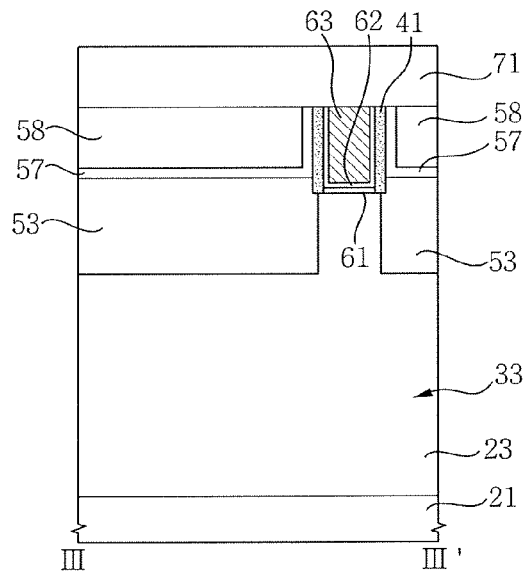
Figure 48:
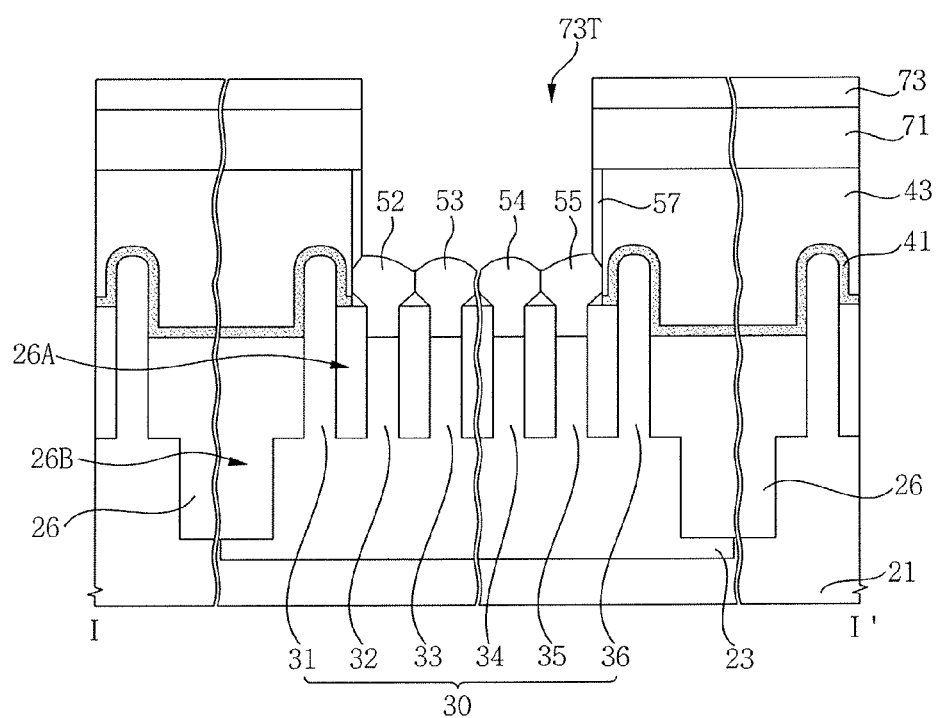
Figure 49:
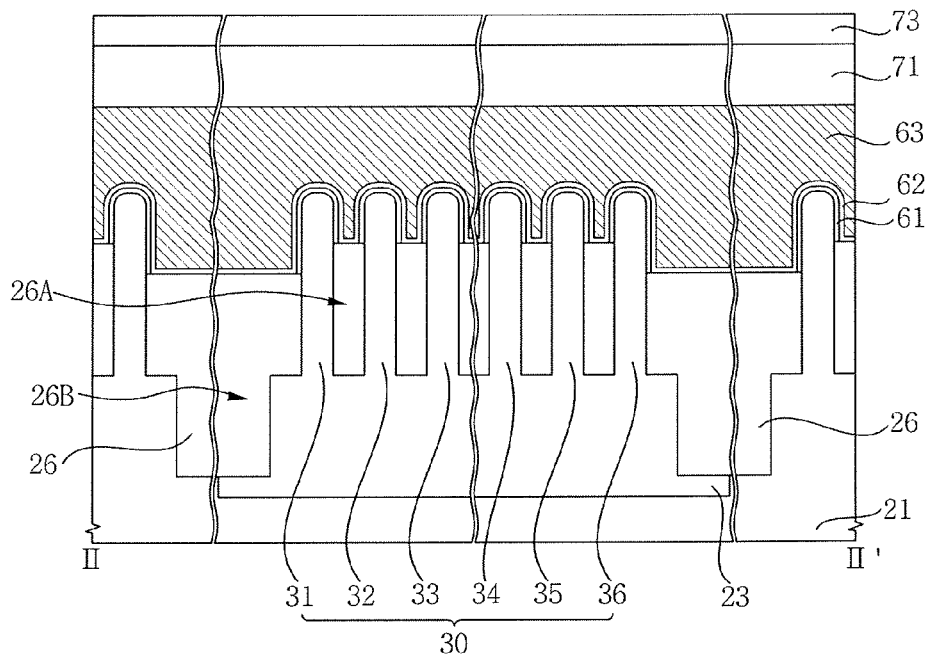
Figure 50:
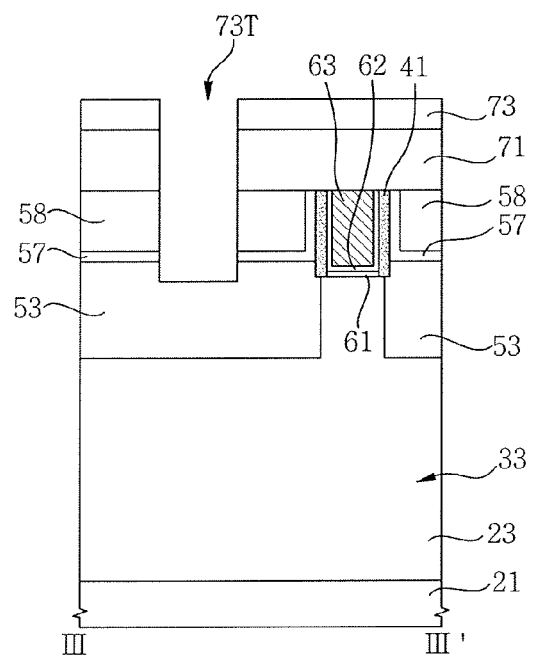

Referring to FIGS. 2, 46, and 47, the upper insulating layer 71 may be formed.

Referring to FIGS. 2, 48, 49, and 50, a second mask pattern 73 may be formed on the upper insulating layer 71. A contact hole 73T may be formed to pass through the upper insulating layer 71, the second lower insulating layer 58, and the etch stop layer 57 to expose the SEG patterns 52, 53, 54, and 55. The second mask pattern 73 may be removed.

Referring to FIGS. 1, 2, 3, and 4, the metal silicide layer 75 and the contact plug 79 may be formed in the contact hole 73T. The contact plug 79 may include the barrier layer 76 and the conductive layer 77.

Figure 51:
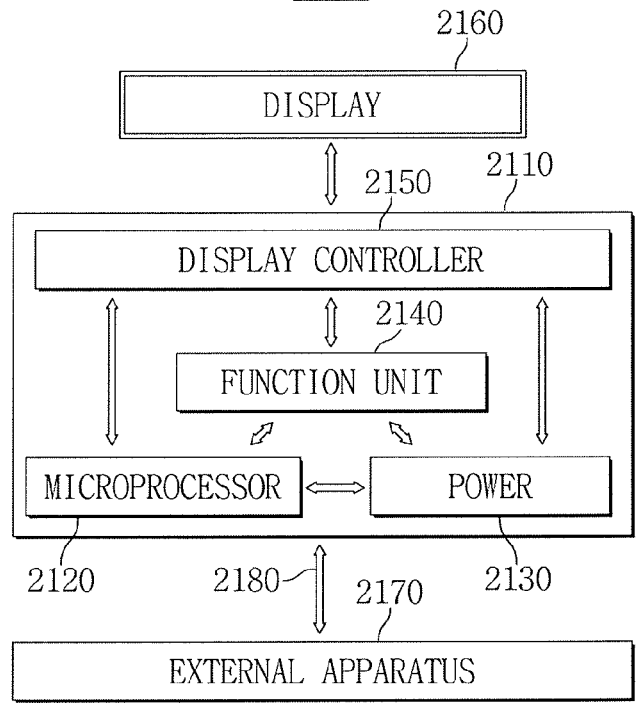
FIGS. 51 and 52 are system block diagrams of electronic devices according to exemplary embodiments of the inventive concept.
Figure 52:
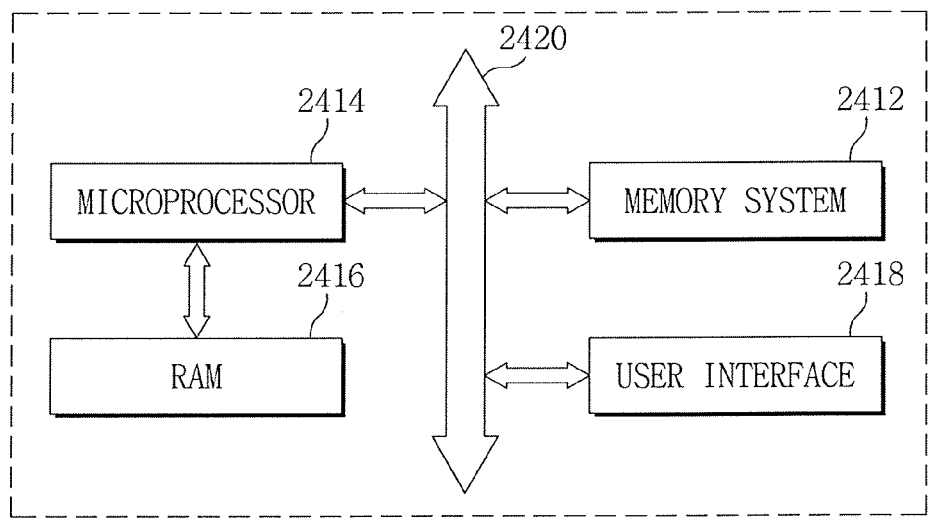

FIGS. 51 and 52 are system block diagrams of electronic devices according to exemplary embodiments of the inventive concept.

Referring to FIG. 51, a semiconductor device similar to that described with reference to FIGS. 1 to 50 may be applied to an electronic system 2100. The electronic system 2100 may include a body 2110, a microprocessor 2120, a power 2130, a function unit 2140, and a display controller 2150. The body 2110 may be a motherboard formed with a printed circuit board (PCB). The microprocessor 2120, the power 2130, the function unit 2140, and the display controller 2150 may be mounted on the body 2110. A display 2160 may be disposed inside or outside of the body 2110. For example, the display 2160 may be disposed on a surface of the body 2110 to display an image processed by the display controller 2150.

The power 2130 may receive a constant voltage from an external battery, divide the voltage into desired voltage levels, and serve to supply the divided voltages to the microprocessor 2120, the function unit 2140, the display controller 2150, etc. The microprocessor 2120 may receive a voltage from the power 2130 and control the function unit 2140 and the display 2160. The function unit 2140 may perform various functions of the electronic system 2100. For example, when the electronic system 2100 is a smart phone, the function unit 2140 may handle dialing or include various components which perform functions of a mobile phone, such as displaying an image to the display 2160, outputting sound to a speaker, etc. In addition, when the electronic system 2100 is a smart phone it may be in communication with an external apparatus 2170, and may serve as a camera image processor when a camera is mounted thereon.

In an application example, when the electronic system 2100 is connected to a memory card or the like to expand the capacity thereof, the function unit 2140 may serve as a memory card controller. The function unit 2140 may exchange signals with the external apparatus 2170 through a wired or wireless communication unit 2180. Furthermore, when the electronic system 2100 uses a Universal Serial Bus (USB) or the like to expand the capacity thereof, the function unit 2140 may serve as an interface controller. In addition, the function unit 2140 may include a mass storage device.

The semiconductor device similar to that described with reference to FIGS. 1 to 50 may be applied to the function unit 2140 or the microprocessor 2120. In other words, a semiconductor device according to an exemplary embodiment of the inventive concept may be applied to the function unit 2140 or the microprocessor 2120.

Referring to FIG. 52, an electronic system 2400 may include at least one of the semiconductor devices according to exemplary embodiments of the inventive concept. The electronic system 2400 may be used in a mobile device or computer. For example, the electronic system 2400 may include a memory system 2412, a microprocessor 2414, a random access memory (RAM) 2416, a bus 2420, and a user interface 2418. The microprocessor 2414, the memory system 2412, and the user interface 2418 may be connected to each other through the bus 2420. The user interface 2418 may be used to input data to or output data from the electronic system 2400. The microprocessor 2414 may program and control the electronic system 2400. The RAM 2416 may be used as an operational memory of the microprocessor 2414. The microprocessor 2414, the RAM 2416, and/or other components may be assembled in a single package. The memory system 2412 may store operational codes of the microprocessor 2414, data processed by the microprocessor 2414, or external input data. The memory system 2412 may include a controller and a memory.

The semiconductor device similar to that described with reference to FIGS. 1 to 50 may be applied to the microprocessor 2414, the RAM 2416, or the memory system 2412. In other words, a semiconductor device according to an exemplary embodiment of the inventive concept may be applied to the microprocessor 2414, the RAM 2416, or the memory system 2412.

In accordance with an exemplary embodiment of the inventive concept, the SEG patterns are formed on the sub-fins except the first sub-fin and the last sub-fin. In other words, the SEG patterns are formed on the sub-fins of a multi-fin active region except the leftmost and rightmost sub-fins (e.g., edge fins) of a multi-fin active region. The contact plugs are formed on the SEG patterns. Therefore, during a process of forming the gate electrodes, defects occurring in the first sub-fin and the last sub-fin can be reduced. Thus, a semiconductor device having increased electrical characteristics can be made.

While the inventive concept has been described in with reference to exemplary embodiments thereof, it will be understood by those skilled in the art that various changes in form and detail may be made thereto without departing from the spirit and scope of the inventive concept as defined by the following claims.

What is claimed is:

1. A semiconductor device, comprising:
   a multi-fin active region having a plurality of sub-fins sequentially arranged on a substrate;
   a gate electrode crossing the multi-fin active region;
   source/drain regions disposed on the sub-fins except a first sub-fin and a last sub-fin; and
   a contact plug disposed on the source/drain regions.

2. The semiconductor device of claim 1, wherein the gate electrode includes:
   a first portion disposed between the sub-fins; and
   a second portion disposed on an outer side of the multi-fin active region,
   wherein a lower end of the second portion of the gate electrode is disposed at a lower level than that of the first portion of the gate electrode.

3. The semiconductor device of claim 1, wherein the source/drain regions include a selective epitaxial growth (SEG) pattern.

4. The semiconductor device of claim 1, wherein sides of the source/drain regions are in contact with each other.

5. The semiconductor device of claim 1, further comprising a device isolation layer disposed between the sub-fins and at an outer side of the multi-fin active region,
   wherein the device isolation layer includes a first portion between the sub-fins and a second portion on the outer side of the multi-fin active region, and
   an upper surface of the second portion of the device isolation layer is disposed at a lower level than that of the first portion of the device isolation layer.

6. The semiconductor device of claim 5, wherein a lower end of the second portion of the device isolation layer is disposed at a lower level than that of the first portion of the device isolation layer.

7. The semiconductor device of claim 5, wherein the second portion of the device isolation layer has a greater horizontal width than the first portion of the device isolation layer.

8. The semiconductor device of claim 5, wherein the gate electrode extends onto the device isolation layer.

9. The semiconductor device of claim 5, wherein the first sub-fin includes a first side surface and a second side surface opposite the first side surface,
   wherein an upper end of the first sub-fin is at a higher level than the device isolation layer, and
   an uppermost contact point of the second portion of the device isolation layer and the first side surface of the first sub-fin is disposed at a lower level than an uppermost contact point of the first portion of the device isolation layer and the second side surface of the first sub-fin.

10. The semiconductor device of claim 1, further comprising:
    a first lower insulating layer covering the first sub-fin and the last sub-fin;
    a second lower insulating layer disposed on the sub-fins except the first sub-fin and the last sub-fin; and
    an upper insulating layer disposed on the first lower insulating layer and the second lower insulating layer,
    wherein the contact plug passes through the upper insulating layer and the second lower insulating layer and is in contact with the sub-fins except the first sub-fin and the last sub-fin.

11. The semiconductor device of claim 10, further comprising an etch stop layer disposed on the source/drain regions and between the first lower insulating layer and the second lower insulating layer.

12. The semiconductor device of claim 11, wherein upper surfaces of the first lower insulating layer, the second lower insulating layer, and the etch stop layer are substantially coplanar.

13. A semiconductor device, comprising:
    a multi-fin active region having a plurality of sub-fins sequentially arranged on a substrate;
    a device isolation layer disposed between the sub-fins and at an outer side of the multi-fin active region;
    a gate electrode crossing the multi-fin active region and extending onto the device isolation layer;
    selective epitaxial growth (SEG) patterns disposed on the sub-fins; and
    a contact plug disposed on the SEG patterns,
    wherein a first sub-fin among the sub-fins is spaced apart from the SEG patterns.

14. The semiconductor device of claim 13, wherein a last sub-fin among the sub-fins is spaced apart from the SEG patterns.

15. The semiconductor device of claim 13, wherein the device isolation layer includes a first portion between the sub-fins and a second portion disposed on the outer side of the multi-fin active region, and
    an upper surface of the second portion of the device isolation layer is disposed at a lower level than that of the first portion of the device isolation layer.

16. The semiconductor device of claim 15, wherein the gate electrode includes:
    a first portion disposed between the sub-fins; and
    a second portion disposed on the outer side of the multi-fin active region,
    wherein a lower end of the second portion of the gate electrode is disposed at a lower level than that of the first portion of the gate electrode.

17. The semiconductor device of claim 15, wherein the first sub-fin includes a first side surface and a second side surface opposite the first side surface,
    wherein an upper end of the first sub-fin is at a higher level than the device isolation layer, and an uppermost contact point of the second portion of the device isolation layer and the first side surface of the first sub-fin is disposed at a lower level than an uppermost contact point of the first portion of the device isolation layer and the second side surface of the first sub-fin.

18. A semiconductor device, comprising:
a plurality of fins sequentially arranged on a well on a substrate;
a plurality of selective epitaxial growth (SEG) patterns overlapping each of the fins, except for a first fin and a last fin of the plurality of fins;
a gate electrode crossing over the plurality of fins; and
a contact plug disposed on the SEG patterns.

19. The semiconductor device of claim 18, wherein the first fin and the last fin are overlapped by a spacer.

20. The semiconductor device of claim 18, wherein the semiconductor device is an input/output device or a diode.

* * * * *